United States Patent
Huang

(10) Patent No.: US 11,088,078 B2
(45) Date of Patent: Aug. 10, 2021

(54) SEMICONDUCTOR DEVICE AND METHOD FOR MANUFACTURING THE SAME

(71) Applicant: NANYA TECHNOLOGY CORPORATION, New Taipei (TW)

(72) Inventor: Chin-Ling Huang, Taoyuan (TW)

(73) Assignee: Nanya Technology Corporation, New Taipei (TW)

( * ) Notice: Subject to any disclaimer, the term of this patent is extended or adjusted under 35 U.S.C. 154(b) by 1 day.

(21) Appl. No.: 16/419,395

(22) Filed: May 22, 2019

(65) Prior Publication Data

US 2020/0373246 A1  Nov. 26, 2020

(51) Int. Cl.
*H01L 23/532* (2006.01)
*H01L 21/768* (2006.01)
*H01L 29/786* (2006.01)
*H01L 27/088* (2006.01)

(52) U.S. Cl.
CPC .. *H01L 23/53238* (2013.01); *H01L 21/76832* (2013.01); *H01L 23/53295* (2013.01); *H01L 27/088* (2013.01); *H01L 29/7869* (2013.01); *H01L 29/78666* (2013.01); *H01L 29/78669* (2013.01); *H01L 29/78675* (2013.01); *H01L 29/78678* (2013.01)

(58) Field of Classification Search
CPC ......... H01L 23/53238; H01L 23/53295; H01L 21/76832; H01L 27/088; H01L 27/78666; H01L 29/78666; H01L 29/78669; H01L 29/78675; H01L 29/78678; H01L 29/7869
See application file for complete search history.

(56) References Cited

U.S. PATENT DOCUMENTS

| 6,956,236 B1* | 10/2005 | Sasaki ..................... H01L 27/12 257/72 |
| 7,498,649 B2* | 3/2009 | Koide ................. G02F 1/13318 257/290 |
| 9,318,618 B2* | 4/2016 | Endo ..................... H01L 27/088 |
| 9,653,479 B2* | 5/2017 | Miyairi ............ H01L 21/76831 |
| 10,115,740 B2* | 10/2018 | Hanada ............... H01L 27/1225 |
| 10,914,978 B2* | 2/2021 | Wang ................ G02F 1/133512 |
| 2004/0141130 A1* | 7/2004 | Kawata ............ G02F 1/136286 349/139 |
| 2005/0029521 A1* | 2/2005 | Yamasaki ......... G02F 1/136213 257/72 |
| 2007/0108472 A1 | 5/2007 | Jeong et al. |

(Continued)

FOREIGN PATENT DOCUMENTS

| TW | 201117360 A | 5/2011 |
| TW | 201532248 A | 8/2015 |
| TW | 201544458 A | 12/2015 |

OTHER PUBLICATIONS

Office Action dated May 25, 2020 related to Taiwanese Application No. 108127016.

*Primary Examiner* — Nathan W Ha
(74) *Attorney, Agent, or Firm* — Muncy, Geissler, Olds & Lowe, P.C.

(57) ABSTRACT

A semiconductor device includes a substrate, a semiconductor layer positioned above the substrate, and a blocking structure positioned between the substrate and the semiconductor layer. A dimension of the blocking structure is greater than a dimension of the semiconductor layer. The blocking structure may suppress diffusion of impurities from layers below the blocking structure.

7 Claims, 22 Drawing Sheets

(56) References Cited

U.S. PATENT DOCUMENTS

| | | | |
|---|---|---|---|
| 2007/0131975 A1* | 6/2007 | Shannon | H01L 29/7839 257/223 |
| 2008/0224184 A1* | 9/2008 | Shannon | H01L 29/78696 257/288 |
| 2014/0217588 A1* | 8/2014 | Zhang | H01L 21/76843 257/751 |
| 2015/0102349 A1 | 4/2015 | Lee et al. | |
| 2015/0179578 A1* | 6/2015 | Jezewski | H01L 21/31144 257/768 |
| 2016/0254277 A1* | 9/2016 | Arao | G02F 1/13394 257/72 |
| 2017/0038657 A1* | 2/2017 | Jeon | G02F 1/136286 |
| 2017/0077199 A1* | 3/2017 | Nguyen | H01L 27/3258 |
| 2017/0131585 A1* | 5/2017 | Cho | H01L 27/1259 |
| 2017/0186843 A1* | 6/2017 | Hosaka | H01L 29/7786 |
| 2017/0309649 A1* | 10/2017 | Hayashi | H01L 29/78696 |
| 2018/0006102 A1* | 1/2018 | Oh | H01L 27/3262 |
| 2018/0067368 A1* | 3/2018 | Izawa | G02F 1/1368 |
| 2018/0122836 A1* | 5/2018 | Kang | H01L 33/502 |
| 2018/0174519 A1* | 6/2018 | Kim | H01L 33/42 |
| 2018/0190747 A1* | 7/2018 | Son | H01L 27/3267 |
| 2018/0275452 A1* | 9/2018 | Wang | G02F 1/134309 |
| 2019/0041932 A1 | 2/2019 | Hanada et al. | |
| 2019/0081090 A1* | 3/2019 | Lee | H01L 27/0288 |
| 2019/0131564 A1* | 5/2019 | Kim | H01L 51/5253 |
| 2019/0172807 A1* | 6/2019 | Kurokawa | H01L 29/0817 |
| 2019/0273069 A1* | 9/2019 | Or-Bach | H01L 25/0657 |
| 2019/0280224 A1* | 9/2019 | Wang | H01L 51/0096 |
| 2019/0324580 A1* | 10/2019 | Tanaka | H01L 27/3272 |
| 2020/0127141 A1* | 4/2020 | Zhang | H01L 29/41733 |
| 2020/0292893 A1* | 9/2020 | Xu | H04N 13/00 |
| 2020/0312839 A1* | 10/2020 | Majhi | H01L 21/02667 |
| 2020/0312926 A1* | 10/2020 | Bae | H01L 27/3262 |
| 2020/0312927 A1* | 10/2020 | Bae | H01L 27/3276 |
| 2020/0335526 A1* | 10/2020 | Nidhi | H01L 27/092 |

* cited by examiner

SEMICONDUCTOR DEVICE AND METHOD FOR MANUFACTURING THE SAME

TECHNICAL FIELD

The present disclosure relates to a semiconductor device and a method for manufacturing the same, and more particularly, to a semiconductor device including a blocking structure and a method for manufacturing the same.

DISCUSSION OF THE BACKGROUND

Semiconductor devices are used in a variety of electronic applications, such as personal computers, cell phones, digital cameras, displays, and other electronic equipment. During the manufacturing of the semiconductor devices, impurities may diffuse into materials of the semiconductor device. Therefore, challenges remain in achieving improved quality, yield, and reliability.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

A semiconductor device includes a substrate, a semiconductor layer positioned above the substrate, and a blocking structure positioned between the substrate and the semiconductor layer. A dimension of the blocking structure is greater than a dimension of the semiconductor layer.

A semiconductor device includes a substrate, a first semiconductor layer positioned above the substrate, a blocking structure positioned between the substrate and the first semiconductor layer, and a second semiconductor layer positioned between the blocking structure and the substrate. The first semiconductor layer is formed of an oxide semiconductor. A dimension of the blocking structure is greater than a dimension of the first semiconductor layer. The second semiconductor layer is formed of hydrogenated amorphous silicon or polycrystalline silicon.

In some embodiments, the semiconductor device further comprises an insulating layer, wherein the insulating layer is positioned between the blocking structure and the substrate.

In some embodiments, the blocking structure is comprised of a barrier layer and a capping layer, the barrier layer has a dimension equal to a dimension of the semiconductor layer, and the capping layer at least covers two sides of the barrier layer.

In some embodiments, the barrier layer is formed of copper, and the capping layer is formed of an alloy of copper and germanium.

In some embodiments, a thickness of the capping layer is about 2 nanometers to 10 nanometers.

The semiconductor device of claim 3, wherein a bottom surface of the semiconductor layer contacts the blocking structure.

In some embodiments, a bottom surface of the semiconductor layer contacts the blocking structure.

In some embodiments, the semiconductor device further comprises a gate layer, wherein the gate layer is opposite to the semiconductor layer.

A method for manufacturing a semiconductor device includes providing a substrate, forming a first semiconductor layer above the substrate, forming a first insulating layer above the first semiconductor layer, forming a first gate layer and a second gate layer above the first insulating layer, forming a blocking structure above the second gate layer, forming a second insulating layer above the second gate layer, and forming a second semiconductor layer above the second insulating layer. The first insulating layer is opposite to the first semiconductor layer. The blocking structure is opposite to the second gate layer. A dimension of the blocking structure is greater than a dimension of the second semiconductor layer.

Due to the function of the blocking structure of the semiconductor device according to the present disclosure, it is possible to suppress diffusion of impurities from layers below the blocking structure and improve the reliability of the semiconductor device. Therefore, a reliable semiconductor device may be provided.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
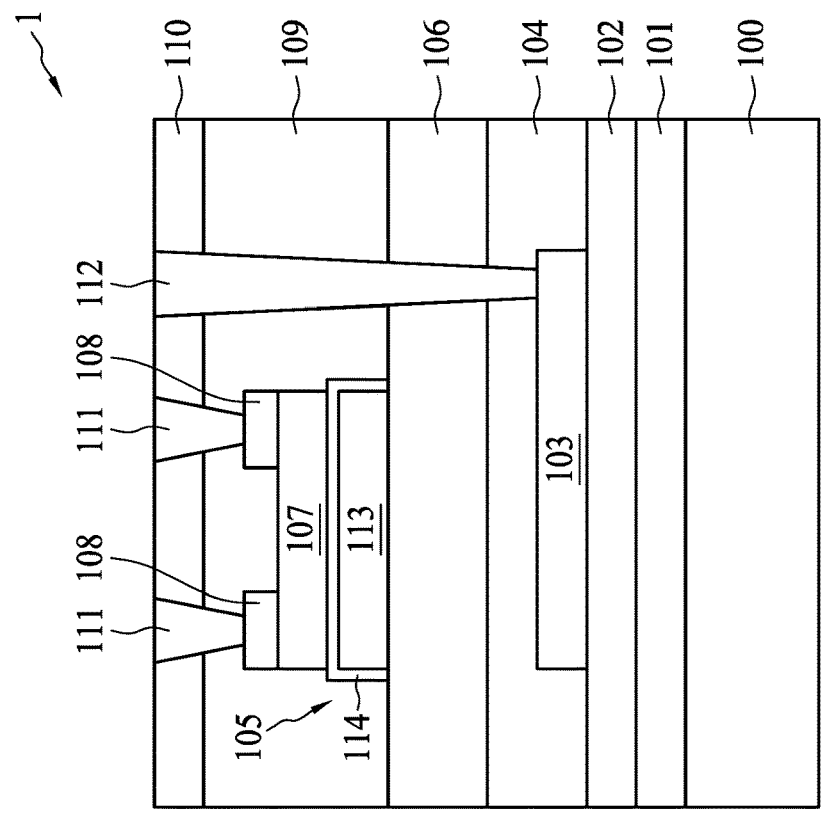
FIG. 1 to FIG. 9 are schematic cross-sectional views illustrating semiconductor devices in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

FIG. 1 is a schematic cross-sectional view of an exemplary semiconductor device 1 in accordance with an embodiment of the present disclosure. The semiconductor device 1 depicted in the embodiment is a thin film transistor (TFT), but the disclosure is not limited by the illustration.

With reference to FIG. 1, the semiconductor device 1 includes, for example, a substrate 100, an insulating layer 101, an insulating layer 102, a gate layer 103, an insulating layer 104, a blocking structure 105, an insulating layer 106, a semiconductor layer 107, two electrodes 108, an insulating layer 109, an insulating layer 110, and a plurality of terminals 111, 112.

With reference to FIG. 1, there is no particular limitation on the substrate 100 as long as it has sufficient heat resistance to withstand at least a heat treatment performed. The substrate 100 is formed of, for example, glass, metal, plastic, ceramic, quartz, sapphire, single-crystal semiconductor, polycrystalline semiconductor material made of silicon, polycrystalline semiconductor material made of silicon carbide, compound semiconductor material made of silicon and germanium, silicon-in-insulator, or another suitable material. The glass substrate may be formed of a material such as soda lime glass or borosilicate glass. The plastic substrate may be made of polyethylene terephthalate (PET), polyethylene naphthalate (PEN), polyimide, or polycarbonate. The plastic substrate may be suitable for processes performed at a temperature of 250° C. or less. Preferably, the substrate 100 is formed of a material with light transmissive property. In the embodiment depicted, the substrate 100 is formed of soda lime glass.

Note that the insulating layers 101, 102, 104, 106, 109, 110 may be referred to as a first insulating layer, a second insulating layer, a third insulating layer, etc., or may be referred to as an interlayer insulating layer. This includes cases in which the insulating layer 101 is referred to as the first insulating layer, the insulating layer 102 is referred to as the second insulating layer, the insulating layer 104 is referred to as the third insulating layer, and the insulating layer 110 is referred to as the interlayer insulating layer, for example.

With reference to FIG. 1, the insulating layer 101 is disposed above the substrate 100. In the embodiment depicted, the insulating layer 101 is disposed on the substrate 100. The insulating layer 101 may be formed as a stacked layer or a single layer using one or more of silicon oxide, silicon oxynitride, silicon nitride oxide, silicon nitride, aluminum oxide, hafnium oxide, yttrium oxide, zirconium oxide, or the like. For example, the insulating layer 101 may be formed using a chemical vapor deposition method, a sputtering method, a thermal oxidation method, or the like. The insulating layer 101 may be formed of a material which may release oxygen at high temperatures. The insulating layer 101 may prevent diffusion of an impurity element from the substrate 100. Therefore, the insulating layer 101 may be formed of a material which has a low diffusion coefficient. The above properties of the insulating layer 101 may also apply to the insulating layers 102, 104, 106, 109, 110 which are described below. In the embodiment depicted, the insulating layer 101 is a single layer and is formed of silicon oxide.

In the present disclosure, silicon oxynitride refers to a substance which contains silicon, nitrogen, and oxygen and in which proportion of oxygen is greater than that of nitrogen. Silicon nitride oxide refers to a substance which contains silicon, oxygen, and nitrogen and in which proportion of nitrogen is greater than that of oxygen.

With reference to FIG. 1, the insulating layer 102 is disposed above the substrate 100 and above the insulating layer 101. In the embodiment depicted, the insulating layer 102 is disposed on the insulating layer 101. The insulating layer 102 is formed of, for example, silicon oxide, silicon oxynitride, silicon nitride oxide, silicon nitride, aluminum oxide, hafnium oxide, yttrium oxide, zirconium oxide or the like and is formed using a chemical vapor deposition method, a sputtering method or the like. In the embodiment depicted, the insulating layer 102 is formed of silicon oxide.

With reference to FIG. 1, the gate layer 103 is disposed above the substrate 100 and above the insulating layer 102. In the embodiment depicted, the gate layer 103 is disposed on the insulating layer 102. The gate layer 103 is formed of, for example, a transparent conductive material such as transparent conductive oxide, conductive polymer, carbon nanotube, graphene, or the like. The transparent conductive oxide is, for example, indium tin oxide, fluorine-doped tin oxide, aluminum zinc oxide, indium zinc oxide, indium cadmium oxide or the like. The conductive polymer is, for example, poly(3,4-ethylenedioxythiophene), poly(3,4-ethylenedioxythiophene):poly(styrene sulfonate), poly(4,4-dioctyl cyclopentadithiophene) or the like. In the embodiment depicted, the gate layer 103 is formed of indium tin oxide. The gate layer 103 serves as a gate of the thin film transistor. Alternatively, in another embodiment depicted, the gate layer 103 is formed of a conductive material such as copper, aluminum, tantalum, tungsten, titanium, molybdenum, chromium, neodymium, scandium, tantalum nitride, titanium nitride or a combination thereof, for example.

With reference to FIG. 1, the insulating layer 104 is disposed above the substrate 100 and above the insulating layer 102. The insulating layer 104 is disposed between the substrate 100 and the semiconductor layer 107, which is described below. In the embodiment depicted, the insulating layer 104 is disposed on the insulating layer 102 and covers the gate layer 103. The insulating layer 104 is formed of, for example, an insulating material containing hydrogen. The insulating layer 104 is formed of, for example, silicon oxynitride, silicon nitride oxide, silicon nitride or the like, and is formed by a chemical vapor deposition method, a sputtering method, or the like. In the embodiment depicted, the insulating layer 104 is formed of silicon nitride. Alternatively, in another embodiment depicted, the insulating layer 104 is formed of silicon oxide, aluminum oxide, hafnium oxide, yttrium oxide, zirconium oxide or the like, for example.

With reference to FIG. 1, the blocking structure 105 is disposed above the substrate 100 and above the insulating layer 104. The blocking structure 105 includes a barrier layer 113 and a capping layer 114. The barrier layer 113 includes a bottom surface, a top surface, and two sides. The bottom surface of the barrier layer 113 faces toward the substrate 100 and is opposite to the top surface of the barrier layer 113. The sides of the barrier layer 113 are opposite to each other. The capping layer 114 at least covers two sides of the barrier layer 113. The barrier layer 113 is disposed between the insulating layer 104 and the semiconductor layer 107, which is described below. A thickness of the capping layer 114 may be about 2 to 200 nanometers. In the embodiment depicted, the blocking structure 105 is disposed on the insulating layer 104. Specifically, the barrier layer 113 is disposed on the insulating layer 104; that is, the bottom surface of the barrier layer 113 contacts the insulating layer 104. The capping layer 114 covers the top surface and sides of the barrier layer 113. The blocking structure 105 may suppress diffusion of an impurity element, for example hydrogen, from the layers below the blocking structure 105. Hence, the barrier layer 113 and the capping layer 114 may be formed of a material that has a low diffusion coefficient or that has the capability to trap the impurity element. Note that, the barrier layer 113 and the capping layer 114 may be formed of the same material, but are not constrained thereto.

With reference to FIG. 1, the barrier layer 113 and the capping layer 114 are formed of, for example, a conductive material such as copper, aluminum, germanium, chromium, nickel, zinc, tin, gold, platinum, palladium, cadmium, cobalt, magnesium, titanium, iron or the combination thereof. The barrier layer 113 and the capping layer 114 are formed by a physical vapor deposition method, a chemical vapor deposition method, a sputtering method, an electroplating method or the like. The capping layer 114 may be formed of the same or different material as the barrier layer 113. The aforementioned conductive material may have the capability to trap hydrogen. In the embodiment depicted, the barrier layer 113 is formed of copper by a physical vapor deposition method. The capping layer 114 is formed of an alloy of copper and germanium. The capping layer 114 is formed using a plasma-enhanced chemical vapor deposition method.

Specifically, the barrier layer 113 made of copper is reacted with germane ($GeH_4$) to selectively grow a layer of copper germanide ($Cu_3Ge$), which is an alloy of copper and germanium, on the barrier layer 113. The layer of copper germanide is the aforementioned capping layer 114 and a thickness of the capping layer 114 is about 2 to 10 nanometers. By using the selective growth chemical vapor deposition method, it is possible to use the same mask for the barrier layer 113 and the semiconductor layer 107 to reduce the number of masks used in manufacturing the semiconductor device 1, and therefore reduce the cost of manufacturing the semiconductor device 1. In addition, while reducing the cost of the manufacturing of the semiconductor device 1, the capping layer 114 formed by the selective growth chemical vapor deposition method enlarges the dimension of the blocking structure 105 and may improve the diffusion-suppressing capability of the blocking structure 105.

Alternatively, in another embodiment depicted, the barrier layer 113 is formed of aluminum using a physical vapor method, and the capping layer 114 is formed of aluminum using an electroplating method. An electroplating method deposits metal in liquid form, and uses equipment that is relatively inexpensive compared to the equipment required for gaseous deposition methods such as physical vapor deposition, chemical vapor deposition, or sputtering, which require, at a minimum, a highly-controlled vacuum environment. That is, it is possible to reduce the manufacturing cost of the semiconductor device 1 by using an electroplating method to form the barrier layer 113 and/or the capping layer 114.

Alternatively, in another embodiment depicted, an adhesion layer (not shown) is disposed between the insulating layer 104 and the barrier layer 113. The adhesion layer may be formed with a stacked layer or a single layer using one or more of tantalum and tantalum nitride. The adhesion layer (not shown) may improve the adhesion between the insulating layer 104 and the barrier layer 113.

Alternatively, in another embodiment depicted, the barrier layer 113 and the capping layer 114 are formed of, for example, an insulating material such as silicon oxide, silicon oxynitride, silicon nitride oxide, silicon nitride, titanium oxide, doped titanium oxide, aluminum oxide, doped aluminum oxide, aluminum nitride, hafnium oxide, yttrium oxide, zirconium oxide or tantalum oxide. Silicon oxynitride, silicon nitride oxide, or silicon nitride use silicon tetrafluoride ($SiF_4$) as a base. Doped titanium oxide and doped aluminum oxide are composed of titanium oxide or aluminum oxide doped by nitrogen, carbon, sulfur or other suitable material. Specifically, the barrier layer 113 is formed of hafnium oxide using chemical vapor deposition, and the capping layer 114 is formed of aluminum oxide using atomic layer deposition. The blocking structure 105 formed of an insulating material may avoid the formation of an unnecessary capacitance structure with a conductive member such as the gate layer 103.

With reference to FIG. 1, the insulating layer 106 is disposed above the gate layer 103 and above the insulating layer 104. In the embodiment depicted, the insulating layer 106 is disposed on the insulating layer 104 and encompasses the blocking structure 105. The insulating layer 106 is formed of, for example, silicon oxide, silicon oxynitride, silicon nitride oxide, silicon nitride, aluminum oxide, hafnium oxide, yttrium oxide, zirconium oxide, titanium oxide or the like. In the embodiment depicted, the insulating layer 106 is formed of silicon oxide.

With reference to FIG. 1, the semiconductor layer 107 is disposed above the substrate 100 and above the blocking structure 105. The semiconductor layer 107 is opposite to the insulating layer 104 with the blocking structure 105 interposed therebetween. The semiconductor layer 107 is opposite to the gate layer 103 with the blocking structure 105 interposed therebetween. The semiconductor layer 107 includes a top surface and a bottom surface. The bottom surface of the semiconductor layer 107 is opposite to the top surface of the semiconductor layer 107. The semiconductor layer 107 may be formed using the same mask as the barrier layer 113, and a dimension of the semiconductor layer 107 may therefore be the same as a dimension of the barrier layer 113. In addition, a dimension of the semiconductor layer 107 may be smaller than a dimension of the barrier layer 113 and the capping layer 114, i.e., the blocking structure 105. Due to the relatively greater dimension of the blocking structure 105 compared to that of the semiconductor layer 107, the blocking structure 105 may suppress diffusion of an impurity element, for example hydrogen, from the layers below the blocking structure 105 to the semiconductor layer 107 more effectively. In the embodiment depicted, the semiconductor layer 107 is disposed on the insulating layer 106. The bottom surface of the semiconductor layer 107 contacts the insulating layer 106. The semiconductor layer 107 is formed of, for example, an oxide semiconductor such as zinc oxide doped with at least one ion of gallium, indium, tin, zirconium, hafnium, cadmium, silver, copper, germanium, gadolinium, aluminum or vanadium. In the embodiment depicted, the semiconductor layer 107 is formed of zinc oxide doped with gallium and indium.

With reference to FIG. 1, the electrodes 108 are disposed on the top surface of the semiconductor layer 107 and are separate from each other. The electrodes 108 respectively serve as a drain and source of the thin film transistor. The electrodes 108 are formed of, for example, a transparent conductive material such as transparent conductive oxide, conductive polymer, carbon nanotube, graphene or the like. The transparent conductive oxide is, for example, indium tin oxide, fluorine-doped tin oxide, aluminum zinc oxide, indium zinc oxide, indium cadmium oxide or the like. The conductive polymer is, for example, poly(3,4-ethylenedioxythiophene), poly(3,4-ethylenedioxythiophene):poly(styrene sulfonate), poly(4,4-dioctyl cyclopentadithiophene), or the like. In the embodiment depicted, the electrodes 108 are formed of indium tin oxide. Alternatively, in another embodiment depicted, the electrodes 108 are formed of a conductive material such as copper, aluminum, titanium, molybdenum, chromium, gold, platinum, nickel or a combination thereof, for example.

With reference to FIG. 1, the insulating layer 109 is disposed above the substrate 100 and above the insulating layer 106. In the embodiment depicted, the insulating layer 109 is disposed on the insulating layer 106 and encompasses the semiconductor layer 107 and the electrodes 108. The insulating layer 110 is disposed above the substrate 100 and above the insulating layer 109. In the embodiment depicted, the insulating layer 110 is disposed on the insulating layer 109. The insulating layers 109, 110 are formed of, for example, silicon oxide, silicon oxynitride, silicon nitride oxide, silicon nitride, aluminum oxide, hafnium oxide, yttrium oxide, zirconium oxide or the like. In the embodiment depicted, the insulating layer 109 is formed of silicon oxide and the insulating layer 110 is formed of silicon nitride. The insulating layer 110 preferably exerts a high vapor barrier in order to prevent moisture from entering from above.

With reference to FIG. 1, the terminals 111 are formed to pass through the insulating layers 110, 109 and electrically connect to the electrodes 108, respectively. The terminal 112 is formed to pass through the insulating layers 110, 109, 106, 104 and electrically connects to the gate layer 103. The terminals 111, 112 are formed of, for example, a conductive material such as copper, aluminum or other suitable material. In the embodiment depicted, the terminals 111, 112 are formed of copper.

With reference to FIG. 1, the semiconductor device 1 is a bottom gate/top contact thin film transistor, but is not constrained thereto. Alternatively, in some embodiments depicted, the insulating layers 101, 102 may be optional, which means that the gate layer 103 and the insulating layer 104 may be disposed on the substrate 100.

During the manufacturing of a semiconductor device, heat treatment is almost always required. As a consequence of the heat treatment, impurities diffuse from lower layers to upper layers, incurring problems, particularly affecting the electrical characteristics of the semiconductor layer. In the embodiment depicted, the blocking structure 105 provides an effective shield for the semiconductor layer 107 due to the greater dimension of the blocking structure 105. Therefore, a reliable semiconductor device may be provided.

Figure 2:
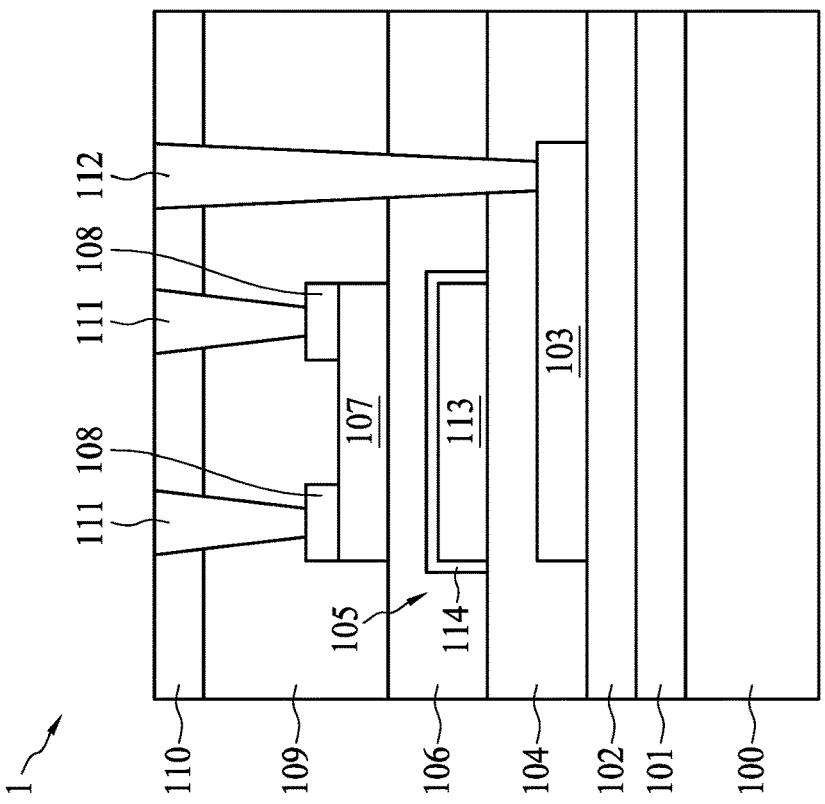

FIG. 2 is a schematic cross-sectional view of an embodiment of the present disclosure in which the blocking structure 105 is contacted to the semiconductor layer 107.

With reference to FIG. 2, in an embodiment, the blocking structure 105 is disposed on the insulating layer 109, and the semiconductor layer 107 is disposed on the capping layer 114 of the blocking structure 105. Specifically, the bottom surface of the barrier layer 113 contacts the insulating layer 106. A bottom surface of the semiconductor layer 107 contacts the capping layer 114 and is opposite to the top surface of the barrier layer 113. The barrier layer 113 and the semiconductor layer 107 are formed by the same mask; therefore, the dimension of the barrier layer 113 is the same as the dimension of the semiconductor layer 107, and the dimension of the blocking structure 105, which includes the barrier layer 113 and the capping layer 114, is greater than the dimension of the semiconductor layer 107. Due to the greater dimension of the blocking structure 105 compared to that of the semiconductor layer 107, and due to the direct contact between the blocking structure 105 and the semiconductor layer 107, the blocking structure 105 may more effectively suppress the diffusion of impurities from the layers below the blocking structure 105 to the semiconductor layer 107.

With reference to FIG. 2, the barrier layer 113 and the capping layer 114 are formed of, for example, an insulating material such as silicon oxide, titanium oxide, doped titanium oxide, aluminum oxide, doped aluminum oxide, hafnium oxide, yttrium oxide, zirconium oxide or tantalum oxide. In an embodiment, the barrier layer 113 is formed of aluminum oxide and the capping layer 114 is formed of hafnium oxide. The blocking structure 105 formed of an insulating material may prevent formation of a short to the semiconductor layer 107 when the blocking structure 105 and the semiconductor layer 107 contact each other.

Figure 4:
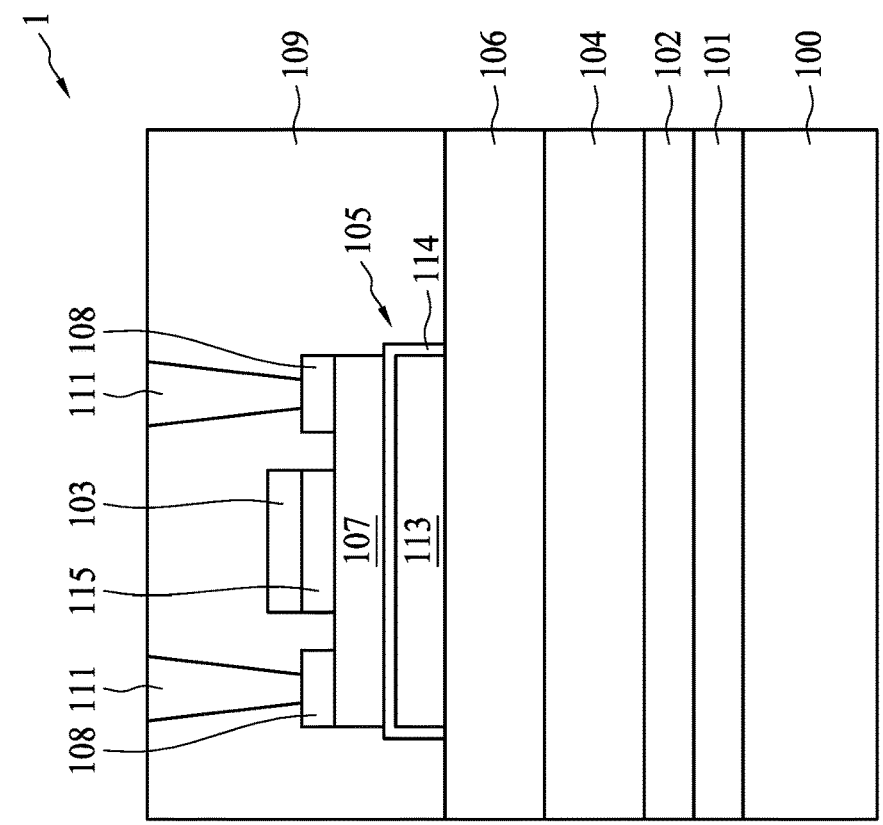
Figure 3:
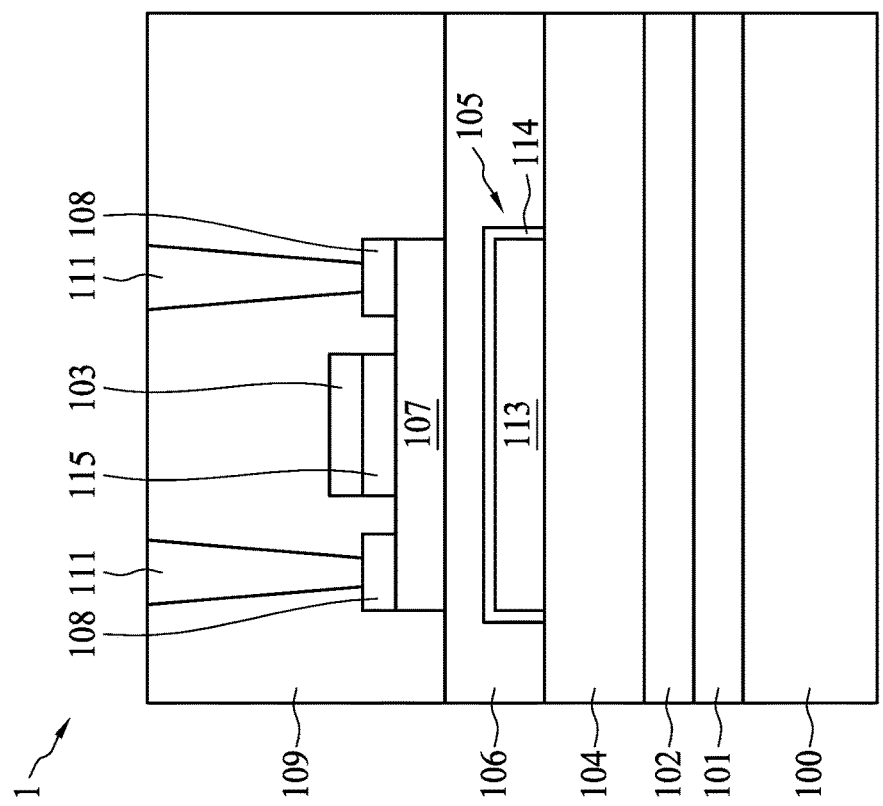

FIG. 3 and FIG. 4 are schematic cross-sectional views of embodiments of the present disclosure in which the gate layer 103 is disposed above the semiconductor layer 107.

With reference to FIG. 3 and FIG. 4, the gate layer 103 is disposed above the semiconductor layer 107. In this respect, the embodiments differ from the embodiments illustrated in FIG. 1 and FIG. 2. In the embodiments of FIG. 3 and FIG. 4, the semiconductor device 1 is a top gate/top contact thin film transistor. An insulating layer 115 is disposed on the top surface of the semiconductor layer 107 and is disposed between the electrodes 108. The insulating layer 115 is formed of, for example, silicon oxide, silicon oxynitride, silicon nitride oxide, silicon nitride, aluminum oxide, hafnium oxide, yttrium oxide, zirconium oxide or the like and is formed by a chemical vapor deposition method, a sputtering method, or the like. In the embodiment depicted, the insulating layer 115 is formed of silicon oxide. The gate layer 103 is disposed above the semiconductor layer 107. Specifically, the gate layer 103 is disposed on the insulating layer 115 and is opposite to the semiconductor layer 107.

In the embodiment illustrated in FIG. 4, the barrier layer 113 and the capping layer 114 are formed of, for example, a material which may release oxygen at a high temperature, such as silicon oxide, titanium oxide, doped titanium oxide, aluminum oxide, doped aluminum oxide, hafnium oxide, yttrium oxide, zirconium oxide or tantalum oxide. In an embodiment, the barrier layer 113 and the capping layer 114 are formed of aluminum oxide. Because the blocking structure 105 directly contacts the semiconductor layer 107, oxygen of the blocking layer formed of aluminum oxide may diffuse into the semiconductor layer 107 when subjected to a high temperature. Accordingly, it is possible to repair defects of the semiconductor layer 107 and improve the electrical characteristics of the semiconductor layer 107, and therefore improve the electrical characteristics of the semiconductor device 1.

Figure 5:
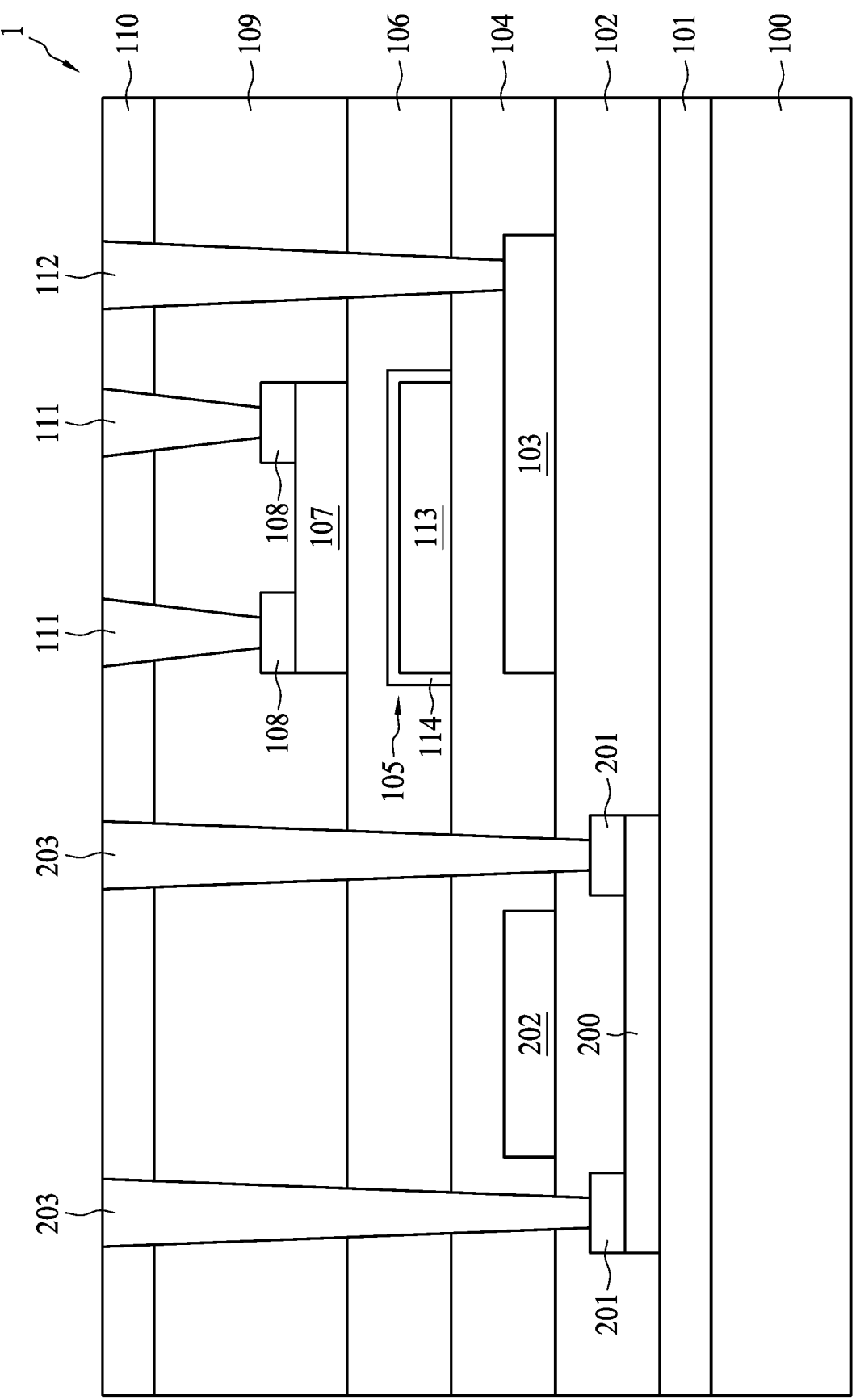

FIG. 5 is a schematic cross-sectional view of an embodiment of the present disclosure in which there are two thin film transistors in the same semiconductor device.

With reference to FIG. 5, in an embodiment, the semiconductor device 1 further includes a top gate/top contact thin film transistor. In this respect, this embodiment differs from the embodiment illustrated in FIG. 1. The top gate/top contact transistor includes a semiconductor layer 200, two electrodes 201, a gate layer 202 and two terminals 203.

Note that the semiconductor layers 107, 200 may be referred to as a first semiconductor layer and a second semiconductor layer. This includes cases in which the semiconductor layer 107 is referred to as the first semiconductor layer and the semiconductor layer 200 is referred to as the second semiconductor layer, and vice versa.

With reference to FIG. 5, the semiconductor layer 200 of the top gate/top contact thin film transistor is disposed on the insulating layer 101 and is encompassed by the insulating layer 102. The semiconductor layer 200 of the top gate/top contact thin film transistor is formed of, for example, hydrogenated amorphous silicon or polycrystalline silicon. In the embodiment depicted, the semiconductor layer 200 of the top gate/top contact thin film transistor is formed of polycrystalline silicon.

With reference to FIG. 5, the electrodes 201 of the top gate/top contact thin film transistor are disposed on a top surface of the semiconductor layer 200 of the top gate/top contact thin film transistor and are separate from each other. The electrodes 201 of the top gate/top contact thin film transistor are opposite to the insulting layer 101. The electrodes 201 of the top gate/top contact thin film transistor are formed of, for example, a transparent conductive material such as transparent conductive oxide, conductive polymer, carbon nanotube, graphene or the like. The transparent conductive oxide is, for example, indium tin oxide, fluorine-doped tin oxide, aluminum zinc oxide, indium zinc oxide, indium cadmium oxide or the like. The conductive polymer is, for example, poly(3,4-ethylenedioxythiophene), poly(3,4-ethylenedioxythiophene):poly(styrene sulfonate), poly(4,4-dioctylcyclopentadithiophene), or the like. In the embodiment depicted, the electrodes 201 are formed of indium tin oxide. Alternatively, in another embodiment, the electrodes 201 of the top gate/top contact thin film transistor are formed of a conductive material such as copper, aluminum, titanium, molybdenum, chromium, gold, platinum, nickel or a combination thereof, for example.

Note that the gate layers 103, 202 may be referred to as a first gate layer and a second gate layer. This includes cases in which the gate layer 103 is referred to as the first gate layer and the gate layer 202 is referred to as the second gate layer, and vice versa.

With reference to FIG. 5, the gate layer 202 of the top gate/top contact thin film transistor is disposed on the insulating layer 102 and is at the same level as the gate layer 103. The gate layer 202 of the top gate/top contact thin film transistor is encompassed by the insulating layer 104. The gate layer 202 of the top gate/top contact thin film transistor is formed of the same material as the gate layer 103, but is not constrained thereto.

With reference to FIG. 5, the terminals 203 of the top gate/top contact thin film transistor are formed to pass through the insulating layers 110, 109, 106, 104, 102 and respectively electrically connected to the electrodes 201 of the top gate/top contact thin film transistor. The terminals 203 of the top gate/top contact thin film transistor are formed of, for example, a conductive material such as copper, aluminum or other suitable material. In the embodiment depicted, the terminals 203 of the top gate/top contact thin film transistor are formed of copper.

Because the gate layer 202 of the top gate/top contact thin film transistor and the gate layer 103 are at the same level and may be formed of the same material, it is possible to manufacture both gate layers 103, 202 at the same time to reduce the manufacturing time of the semiconductor device 1. In addition, the gate layer 202 and the semiconductor layer 200 of the top gate/top contact thin film transistor are all at levels below the blocking structure 105; hence, the blocking structure 105 may also suppress diffusion of impurities from the gate layer 202 and the semiconductor layer 200 of the top gate/top contact thin film transistor to ensure the electrical characteristics of the semiconductor layer 107.

Figure 6:
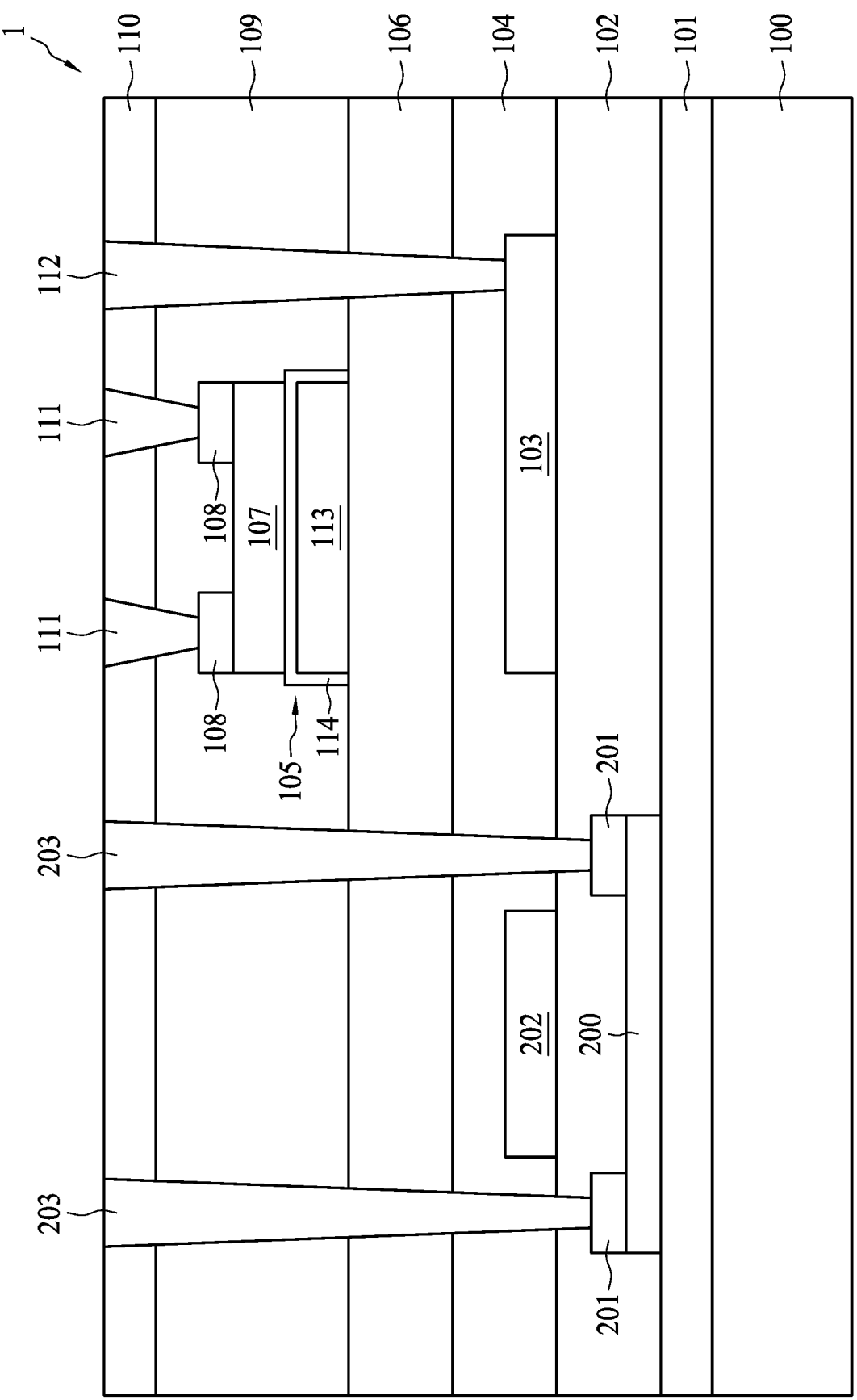

FIG. 6 is a schematic cross-sectional view of an embodiment of the present disclosure in which the blocking structure 105 contacts the semiconductor layer 107. This embodiment is derived from the embodiments illustrated in FIG. 2 and FIG. 5, and shares all the advantages obtained from such embodiments. In the embodiment illustrated in FIG. 6, the semiconductor device 1 includes two transistors, wherein one of the transistors is a top gate/top contact transistor comprised of the semiconductor layer 200 and the gate layer 202. The other transistor is a bottom gate/top contact transistor comprised of the gate layer 103, the semiconductor layer 107, and the blocking structure 105, which is in contact with the semiconductor layer 107.

Figure 7:
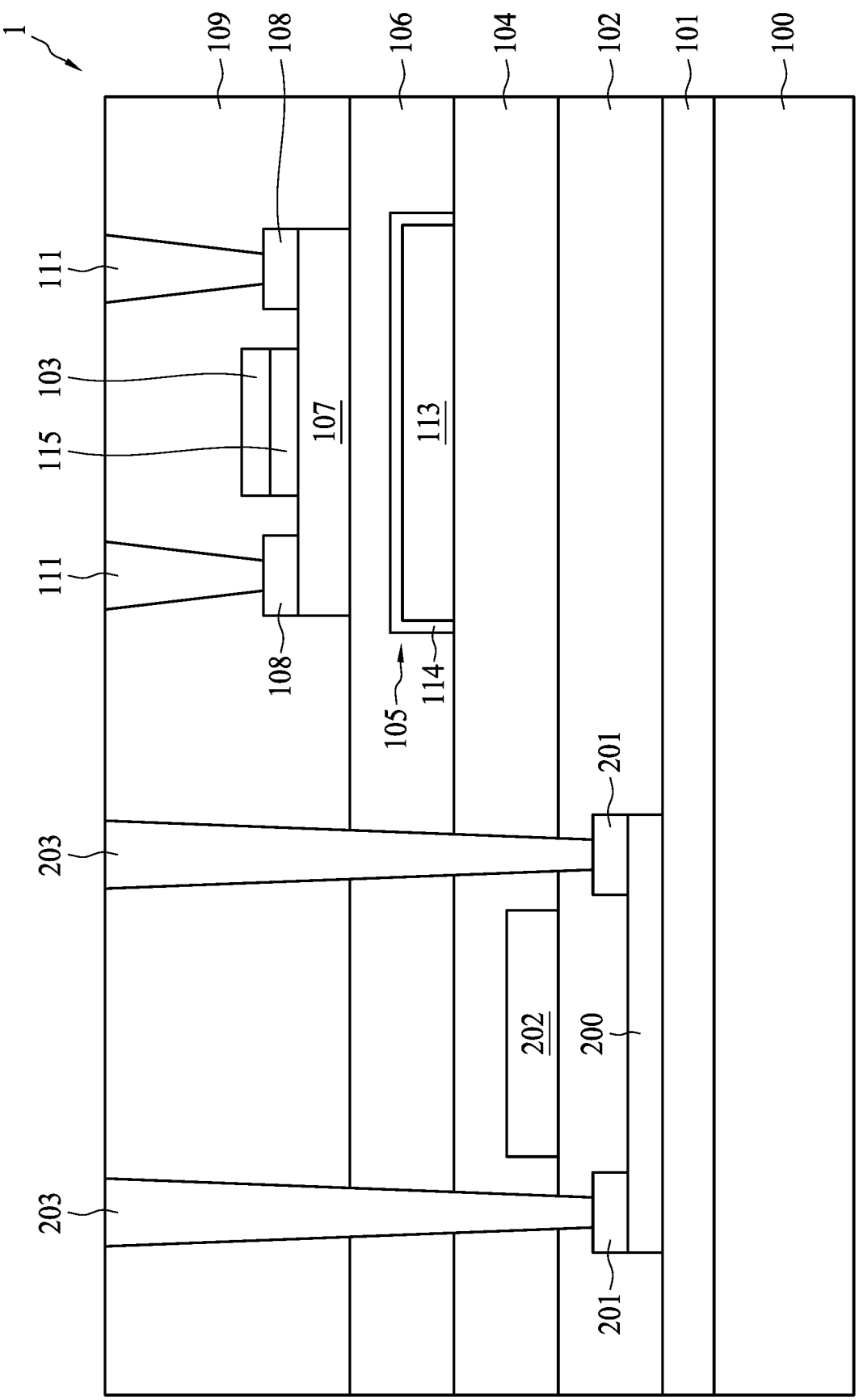

FIG. 7 is a schematic cross-sectional view of an embodiment of the present disclosure in which the semiconductor device further includes a top gate/top contact thin film transistor. This embodiment is derived from the embodiments illustrated in FIG. 3 and FIG. 5, and shares all the advantages obtained from such embodiments. In the embodiment illustrated in FIG. 7, the semiconductor device 1 includes two transistors, wherein one of the transistors is a top gate/top contact transistor comprised of the semiconductor layer 200 and the gate layer 202. The other transistor is a top gate/top contact transistor comprised of the gate layer 103, the semiconductor layer 107, and the blocking structure 105 below the semiconductor layer 107.

Figure 8:
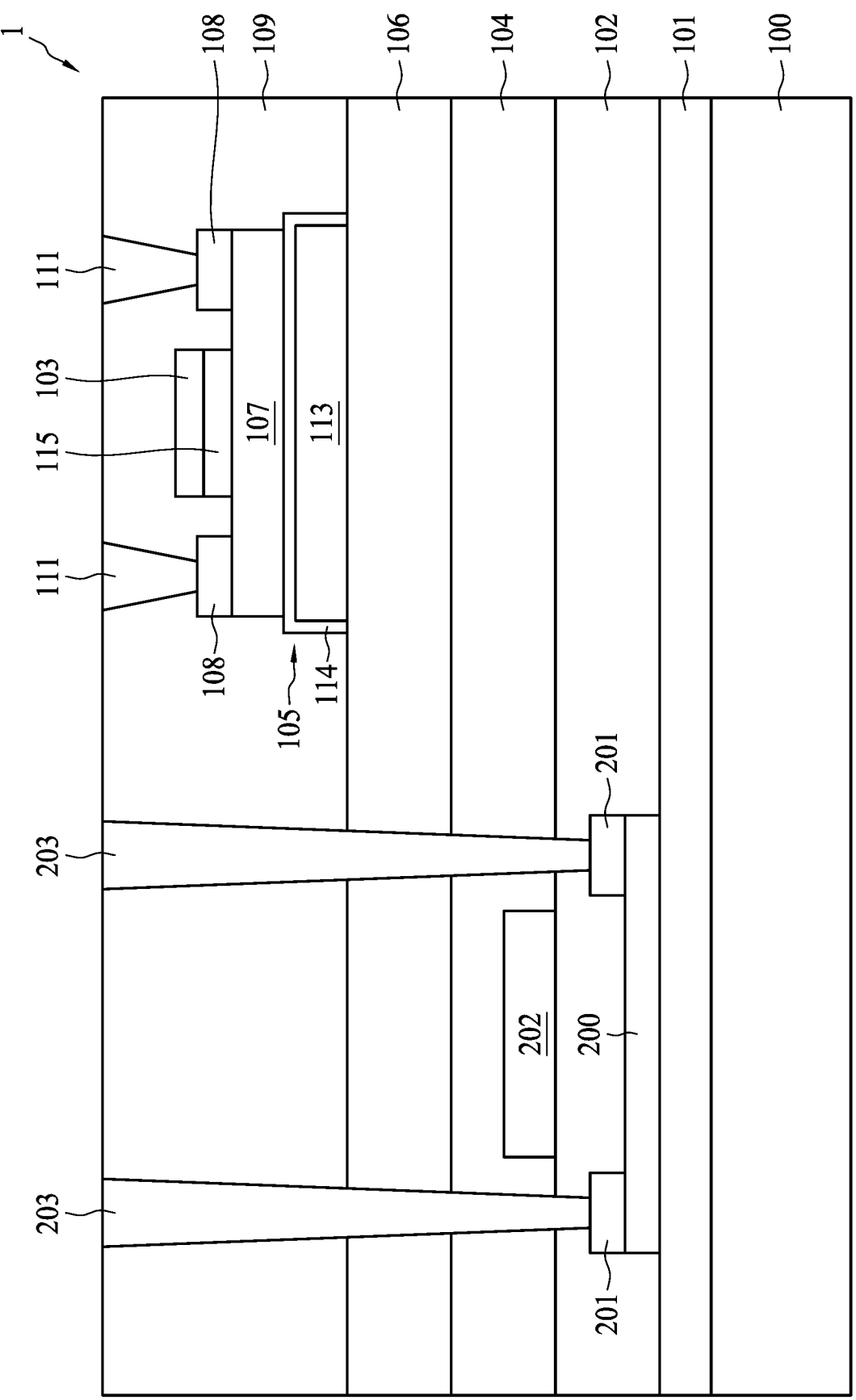

FIG. 8 is a schematic cross-sectional view of an embodiment of the present disclosure in which the blocking structure 105 contacts the semiconductor layer 107. This embodiment is derived from the embodiments illustrated in FIG. 4 and FIG. 6, and shares all the advantages obtained from such embodiments. In the embodiment illustrated in FIG. 8, the semiconductor device 1 includes two transistors, wherein one of the transistors is a top gate/top contact transistor comprised of the semiconductor layer 200 and the gate layer 202. The other transistor is a top gate/top contact transistor comprised of the gate layer 103, the semiconductor layer 107, and the blocking structure 105, which is in contact with the semiconductor layer 107.

Figure 9:
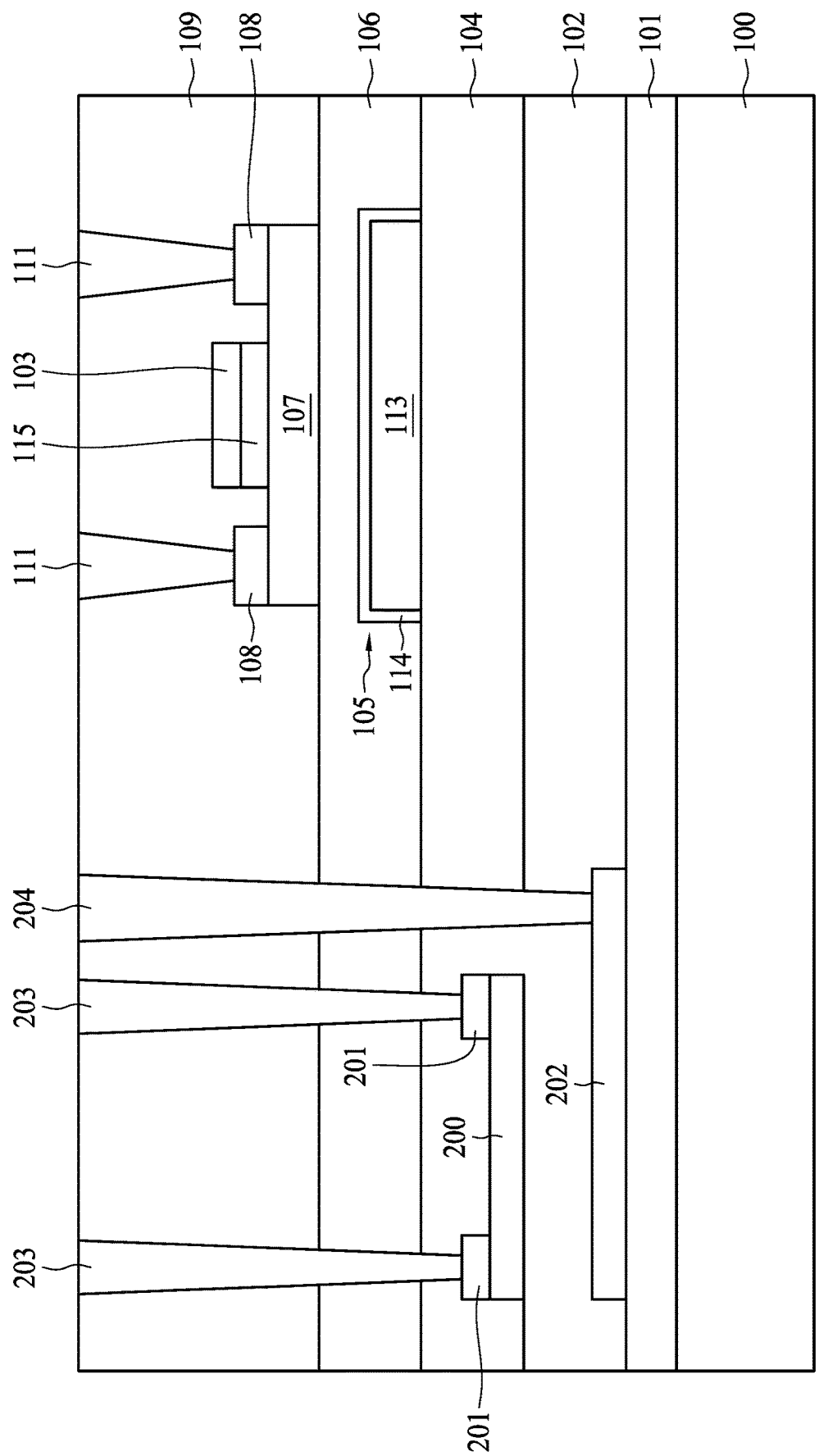

FIG. 9 is a schematic cross-sectional view of an embodiment of the present disclosure in which the semiconductor device further includes a bottom gate/top contact thin film transistor. This embodiment is derived from the embodiments illustrated in FIG. 3 and FIG. 5, and shares all advantages obtained from such embodiments. In the embodiment illustrated in FIG. 9, the gate layer 202 of the bottom gate/top contact thin film transistor is disposed on the insulating layer 101. A terminal 204 of the bottom gate/top contact thin film transistor is formed to pass through the insulating layers 109, 106, 104, 102 and electrically connects to the gate layer 202 of the bottom gate/top contact thin film transistor. The semiconductor layer 200 of the bottom gate/top contact thin film transistor is disposed on the insulating layer 102. Two electrodes 201 of the bottom gate/top contact thin film transistor are disposed on a top surface of the semiconductor layer 200 of the bottom gate/top contact thin film transistor and are separate from each other. The electrodes 201 of the bottom gate/top contact thin film transistor are opposite to the insulating layer 102. Two terminals 203 of the bottom gate/top contact thin film transistor are formed to pass through the insulating layers 109, 106, 104 and respectively electrically connect to the electrodes 201 of the bottom gate/top contact thin film transistor.

Figure 10:
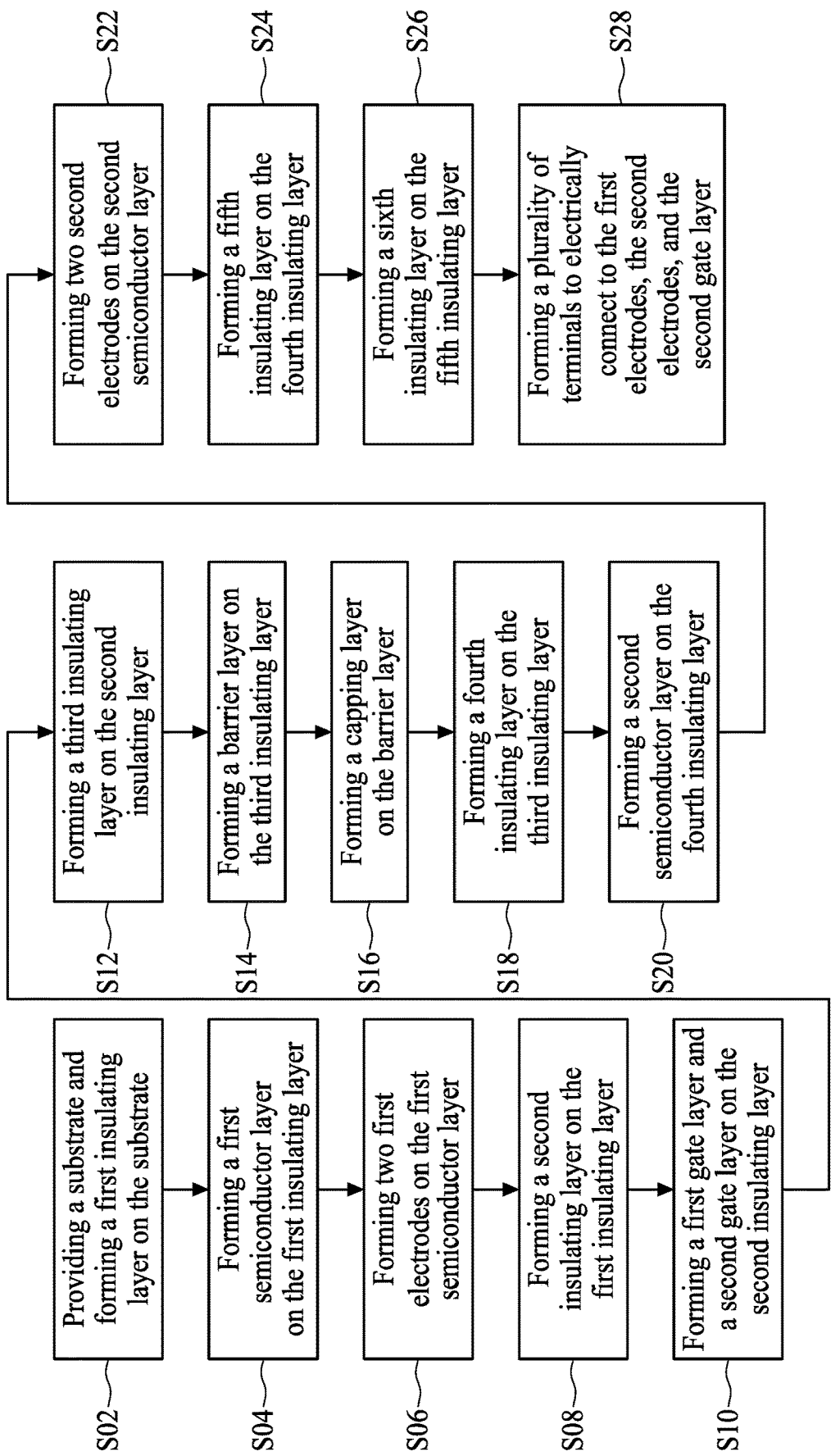
FIG. 10 illustrates, in flowchart diagram form, a method for manufacturing a semiconductor device in accordance with an embodiment of the present disclosure.

FIG. 10 illustrates, in flowchart diagram form, a method for manufacturing a semiconductor device in accordance with an embodiment of the present disclosure.

FIG. 11 to FIG. 24 are schematic cross-sectional views illustrating steps of a manufacturing process of an exemplary semiconductor device in accordance with an embodiment of the present disclosure.

Figure 11:
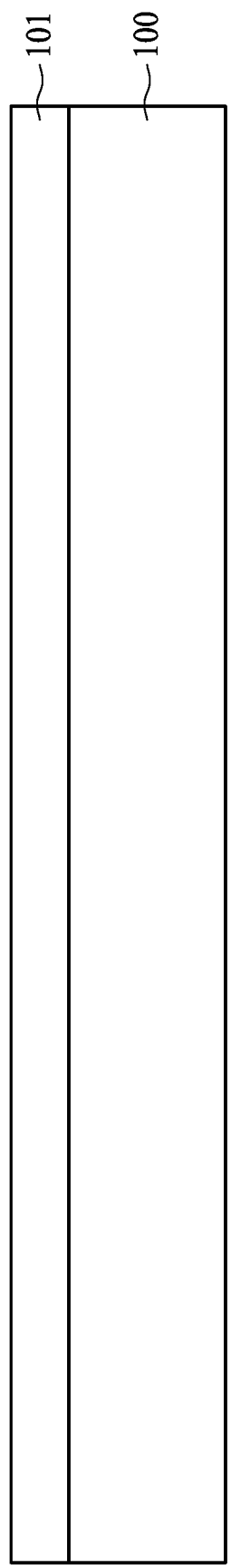
FIG. 11 to FIG. 24 are schematic cross-sectional views illustrating a process of manufacturing a semiconductor device in accordance with an embodiment of the present disclosure.

With reference to FIG. 10 and FIG. 11, at step S02, a substrate 100 is provided. The substrate 100 may be formed of, for example, glass, metal, plastic, ceramic, quartz, sapphire, single-crystal semiconductor, polycrystalline semiconductor made of silicon, polycrystalline semiconductor made of silicon carbide, compound semiconductor made of silicon and germanium, silicon-in-insulator, or another suitable material. In the embodiment depicted, the substrate 100 is formed of glass, such as soda lime glass.

With reference to FIG. 10 and FIG. 11, at step S02, a first insulating layer 101 is formed on the substrate 100 using a chemical vapor deposition method, a sputtering method, a thermal oxidation method or the like. The first insulating layer 101 may be formed of silicon oxide, silicon oxynitride, silicon nitride oxide, silicon nitride, aluminum oxide, hafnium oxide, yttrium oxide, zirconium oxide or the like. In the embodiment depicted, the first insulating layer 101 is formed of silicon oxide.

Figure 12:
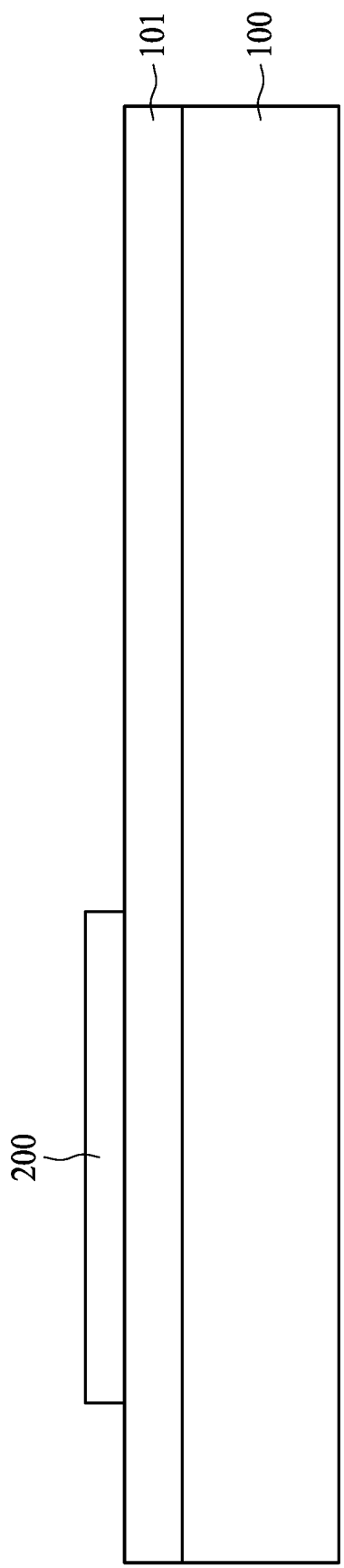

With reference to FIG. 10 and FIG. 12, at step S04, a first semiconductor layer 200 is formed on the first insulating layer 101 using a chemical vapor deposition method or the like. The first semiconductor layer 200 may be formed of hydrogenated amorphous silicon or polycrystalline silicon. In the embodiment depicted, the first semiconductor layer 200 is formed of polycrystalline silicon.

Figure 13:
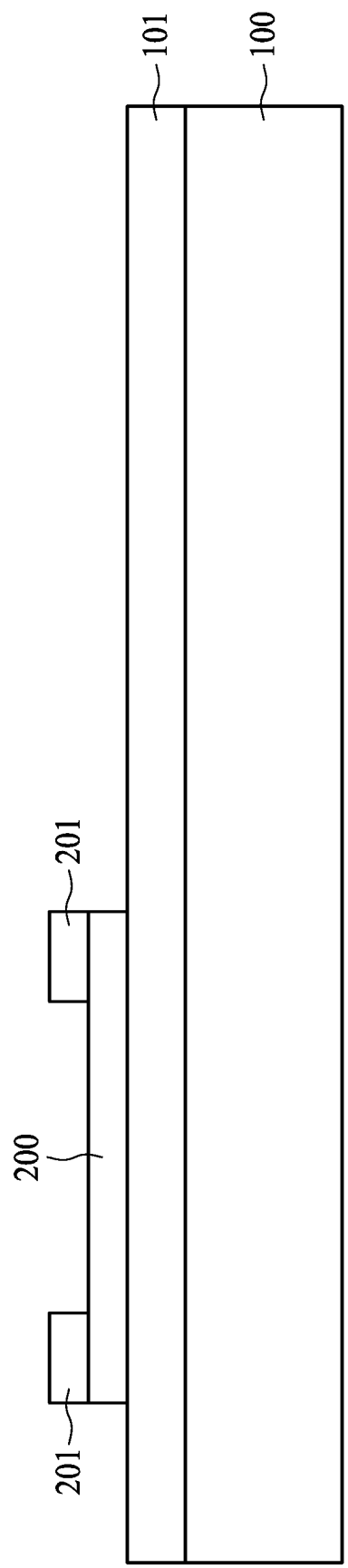

With reference to FIG. 10 and FIG. 13, at step S06, two first electrodes 201 are formed on the first semiconductor layer 200 and are separate from each other. The first electrodes 201 may be formed of a transparent conductive material such as transparent conductive oxide, conductive polymer, carbon nanotube, graphene or the like. In the embodiment depicted, the first electrodes 201 are formed of transparent conductive oxide like indium tin oxide.

Figure 14:
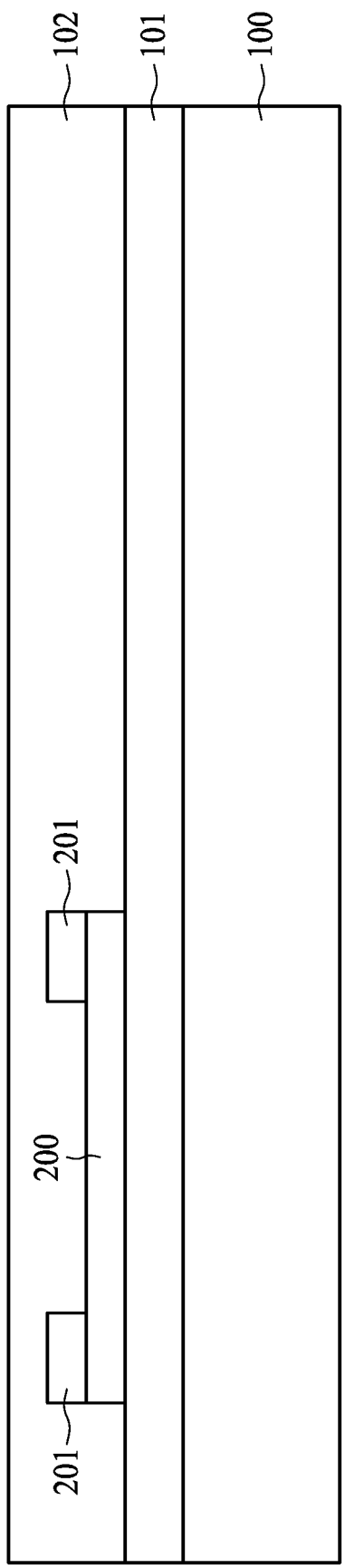

With reference to FIG. 10 and FIG. 14, at step S08, a second insulating layer 102 is formed on the first insulating layer 101 and encompasses the first semiconductor layer 200 and the first electrodes 201. The second insulating layer 102 may be formed using a chemical vapor deposition method, a sputtering method or the like. The second insulating layer 102 may be formed of silicon oxide, silicon oxynitride, silicon nitride oxide, silicon nitride, aluminum oxide, hafnium oxide, yttrium oxide, zirconium oxide or the like. In the embodiment depicted, the second insulating layer 102 is formed of silicon oxide.

Figure 15:
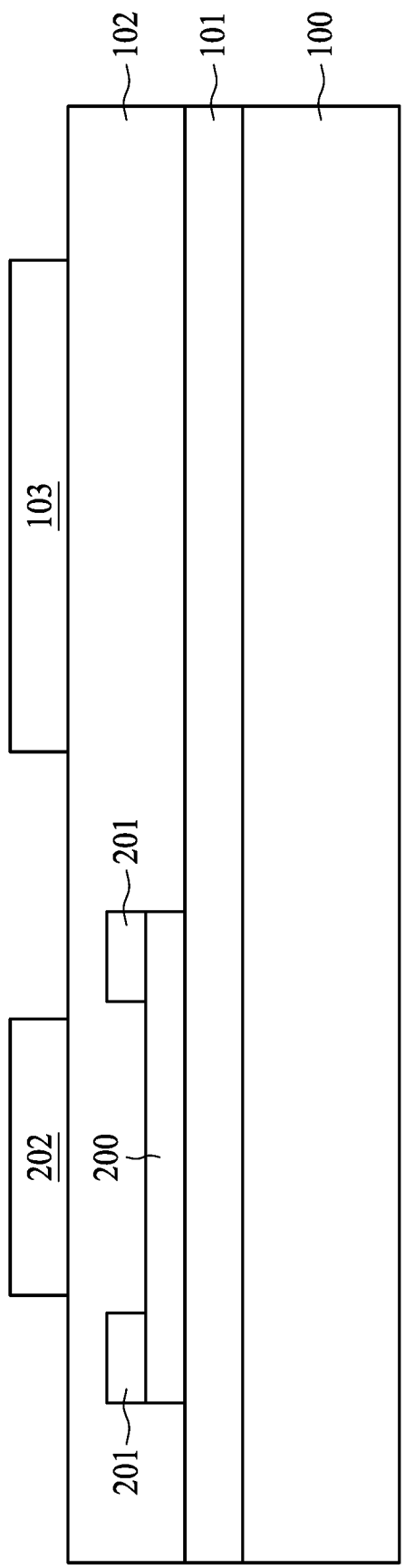

With reference to FIG. 10 and FIG. 15, at step S10, a first gate layer 202 and a second gate layer 103 are formed on the second insulating layer 102 at the same time and are separate from each other. The first gate layer 202 is opposite to the first semiconductor layer 200. The first gate layer 202 and the second gate layer 103 are formed of the same material. The first gate layer 202 and the second gate layer 103 are formed of, for example, a transparent conductive material or a conductive material. In the embodiment depicted, the first gate layer 202 and the second gate layer 103 are formed of a transparent conductive material such as indium tin oxide.

Figure 16:
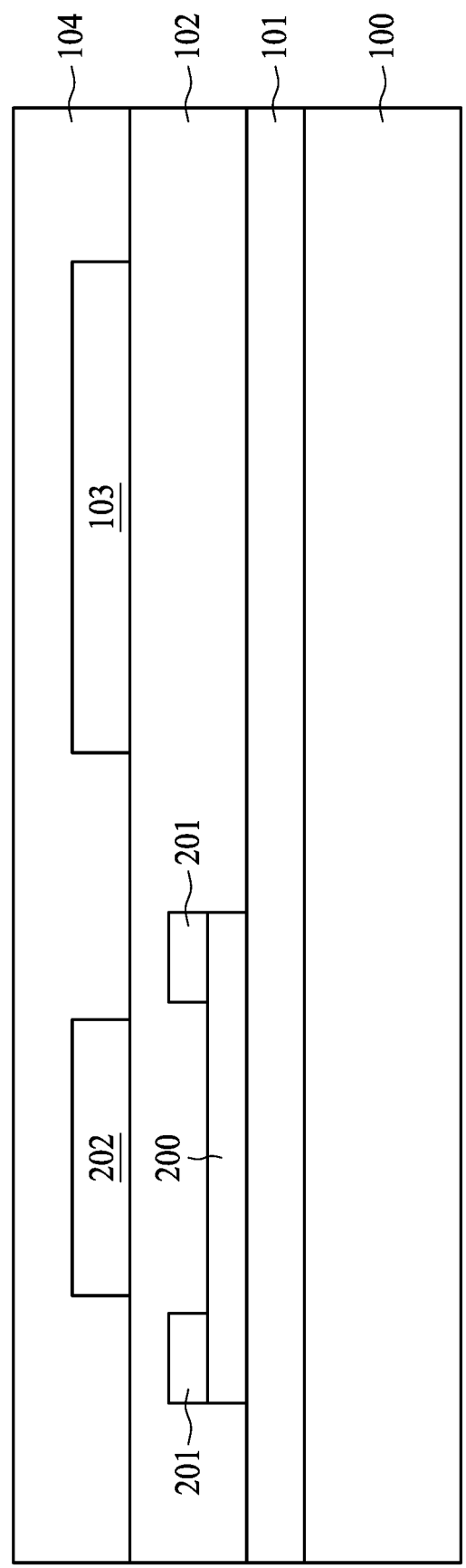

With reference to FIG. 10 and FIG. 16, at step S12, a third insulating layer 104 is formed on the second insulating layer 102 and encompasses the first gate layer 202 and the second gate layer 103. The third insulating layer 104 may be formed using a chemical vapor deposition method, a sputtering method or the like. The third insulating layer 104 is formed of, for example, silicon oxynitride, silicon nitride oxide, silicon nitride or the like. In the embodiment depicted, the third insulating layer 104 is formed of silicon oxide.

Figure 17:
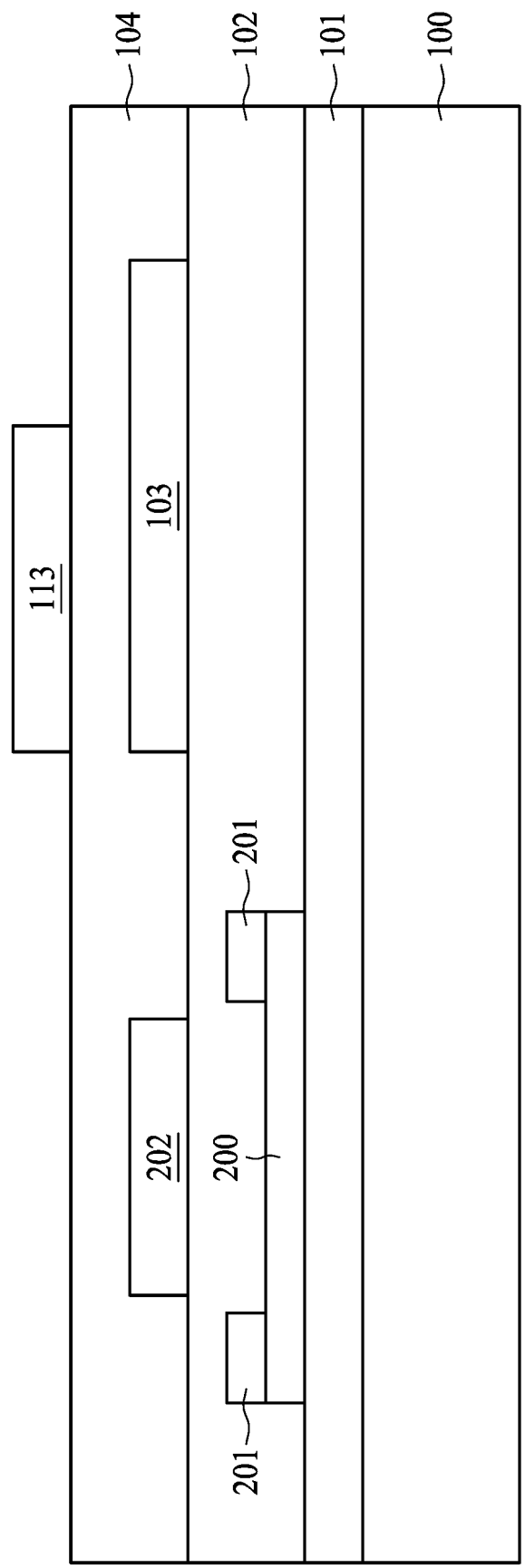

With reference to FIG. 10 and FIG. 17, at step S14, a barrier layer 113 is formed on the third insulating layer 104 using a chemical vapor deposition method, a physical vapor deposition method, a sputtering method or an electroplating method. The barrier layer 113 is opposite to the second gate layer 103. The barrier layer 113 may be formed of a conductive or an insulating material. In the embodiment depicted, the barrier layer 113 is formed of copper using a physical vapor deposition method.

Figure 18:
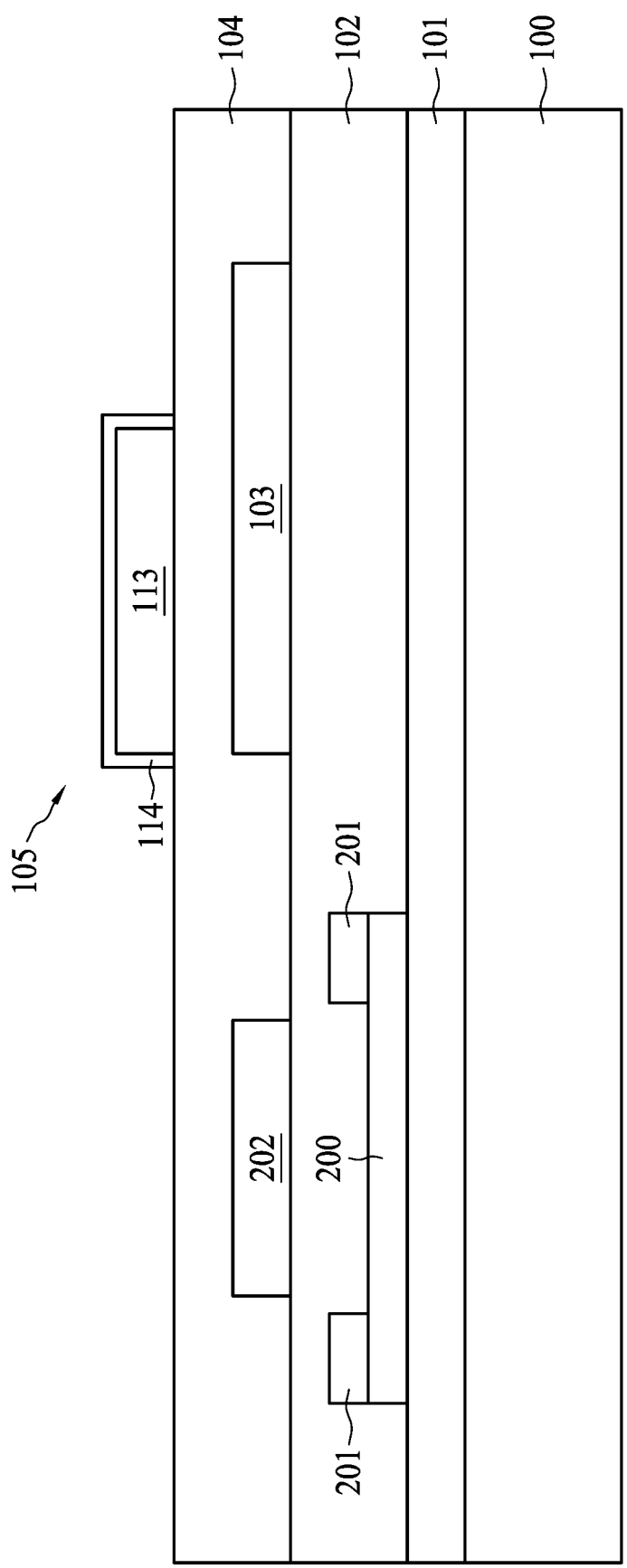

With reference to FIG. 10 and FIG. 18, at step S16, a capping layer 114 is formed on the barrier layer 113. The capping layer 114 covers a top surface and two sides of the barrier layer 113. The barrier layer 113 and the capping layer comprise a blocking structure 105. The capping layer 114 may be formed of a conductive material or an insulating material. In the embodiment depicted, the capping layer 114 is formed of copper germanide using a plasma-enhanced chemical vapor deposition method. Specifically, the capping layer 114 is formed by reacting the barrier layer 113 made of copper with germane to selectively grow a layer of copper germanide on the barrier layer 113. A thickness of the layer of copper germanide is about 2 to 10 nanometers. The selective growth capping layer 114 on the barrier layer 113 may reduce the complexity of the manufacturing process.

Figure 19:
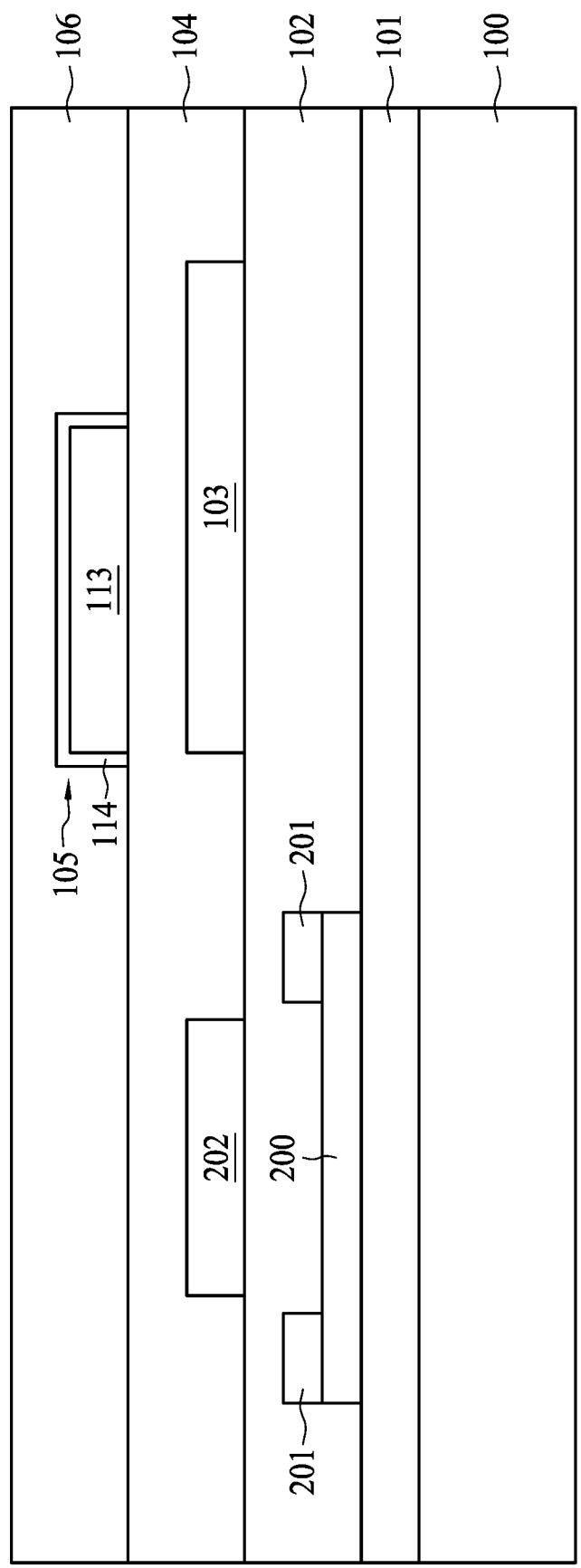

With reference to FIG. 10 and FIG. 19, at step S18, a fourth insulating layer 106 is formed on the third insulating layer 104 and encompasses the blocking structure 105. The fourth insulating layer 106 is formed of, for example, silicon oxide, silicon oxynitride, silicon nitride oxide, silicon nitride, aluminum oxide, hafnium oxide, yttrium oxide, zirconium oxide, titanium oxide or the like. In the embodiment depicted, the fourth insulating layer 106 is formed of silicon oxide.

Figure 20:
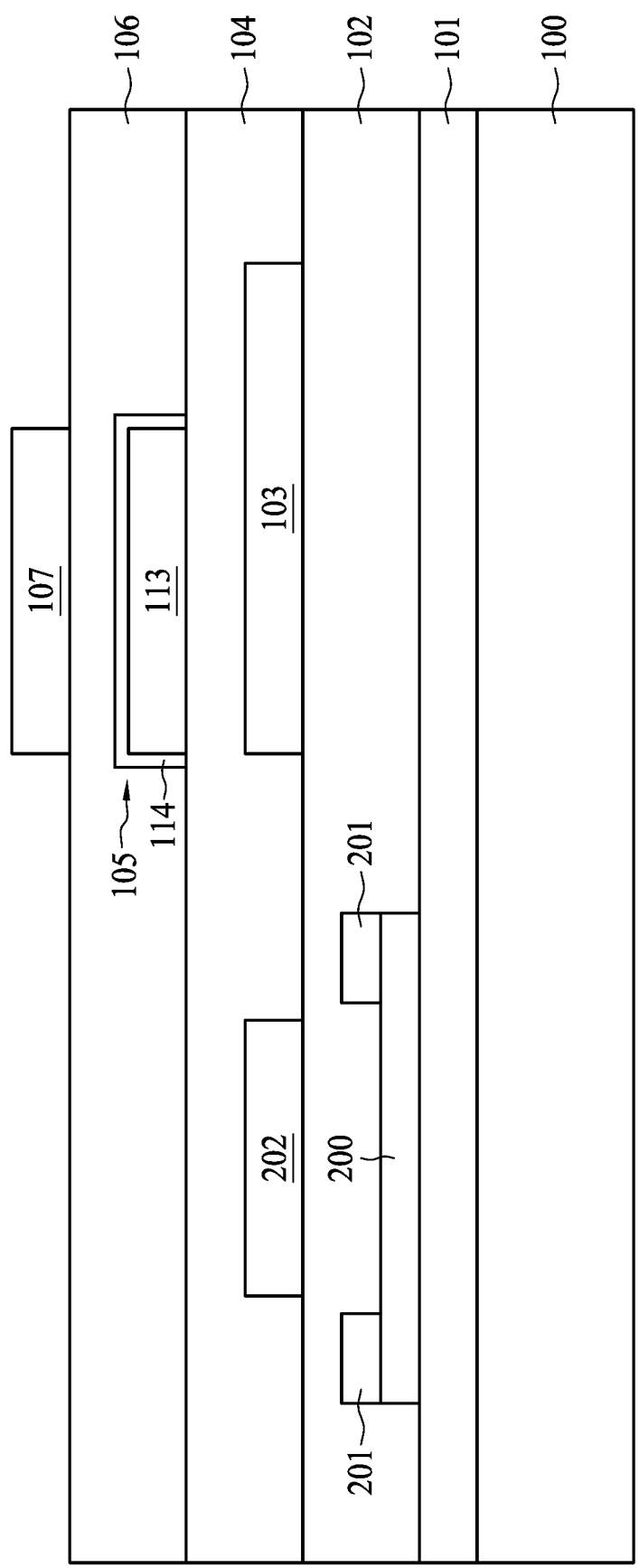

With reference to FIG. 10 and FIG. 20, at step S20, a second semiconductor layer 107 is formed on the fourth insulating layer 106 and is formed using the same mask as the barrier layer. The second semiconductor layer 107 has the same dimension as the barrier layer 113. The second semiconductor layer 107 is opposite to the second gate layer 103. The second semiconductor layer 107 is formed of, for example, zinc oxide doped with at least one ion of gallium, indium, tin, zirconium, hafnium, cadmium, silver, copper, germanium, gadolinium, aluminum or vanadium. In the embodiment depicted, the second semiconductor layer 107 is formed of zinc oxide doped with gallium and indium.

Figure 21:
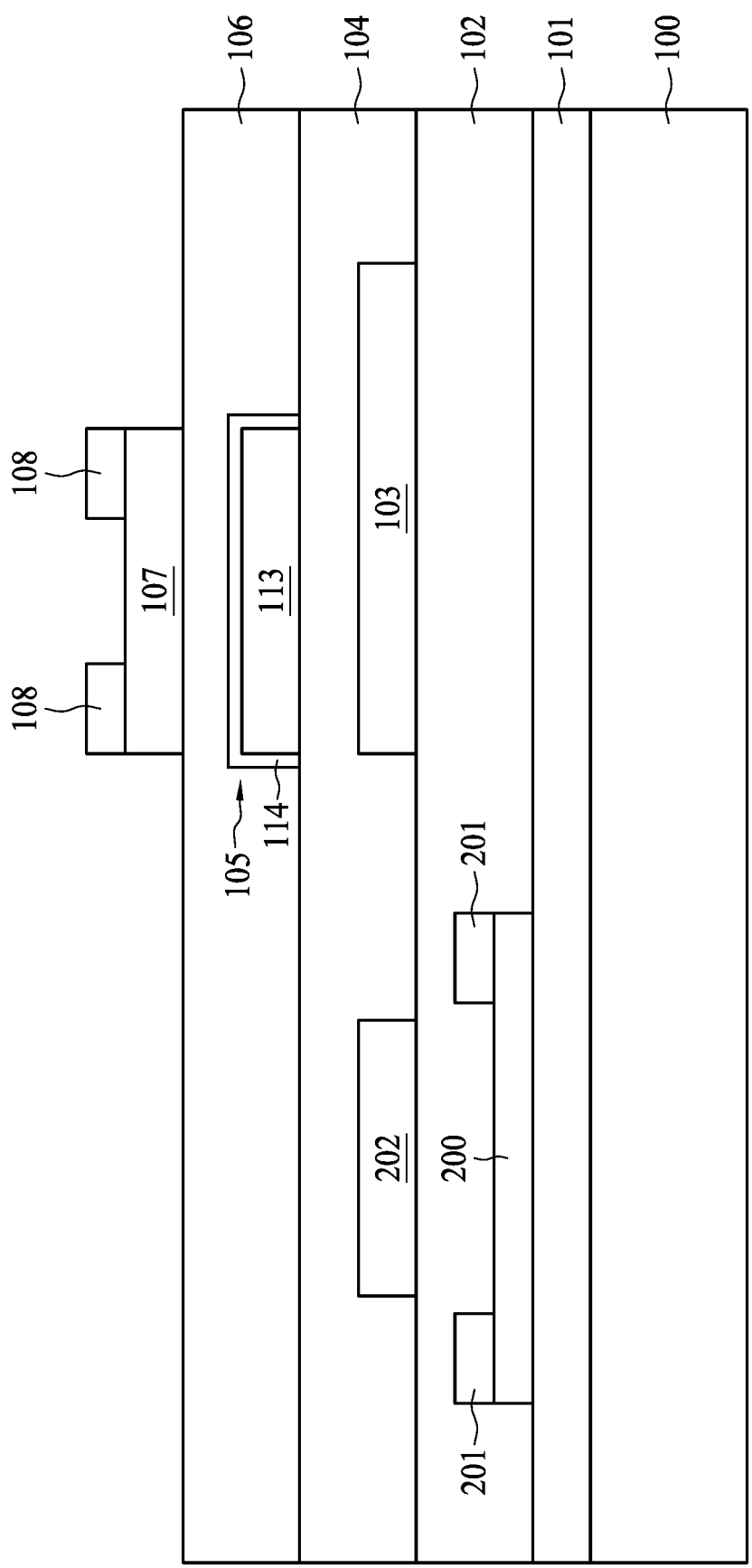

With reference to FIG. 10 and FIG. 21, at step S22, two second electrodes 108 are formed on the second semiconductor layer 107 and are separate from each other. The second electrodes 108 may be formed of a transparent conductive material such as transparent conductive oxide, conductive polymer, carbon nanotube, graphene or the like. In the embodiment depicted, the second electrodes 108 are formed of transparent conductive oxide like indium tin oxide.

Figure 22:
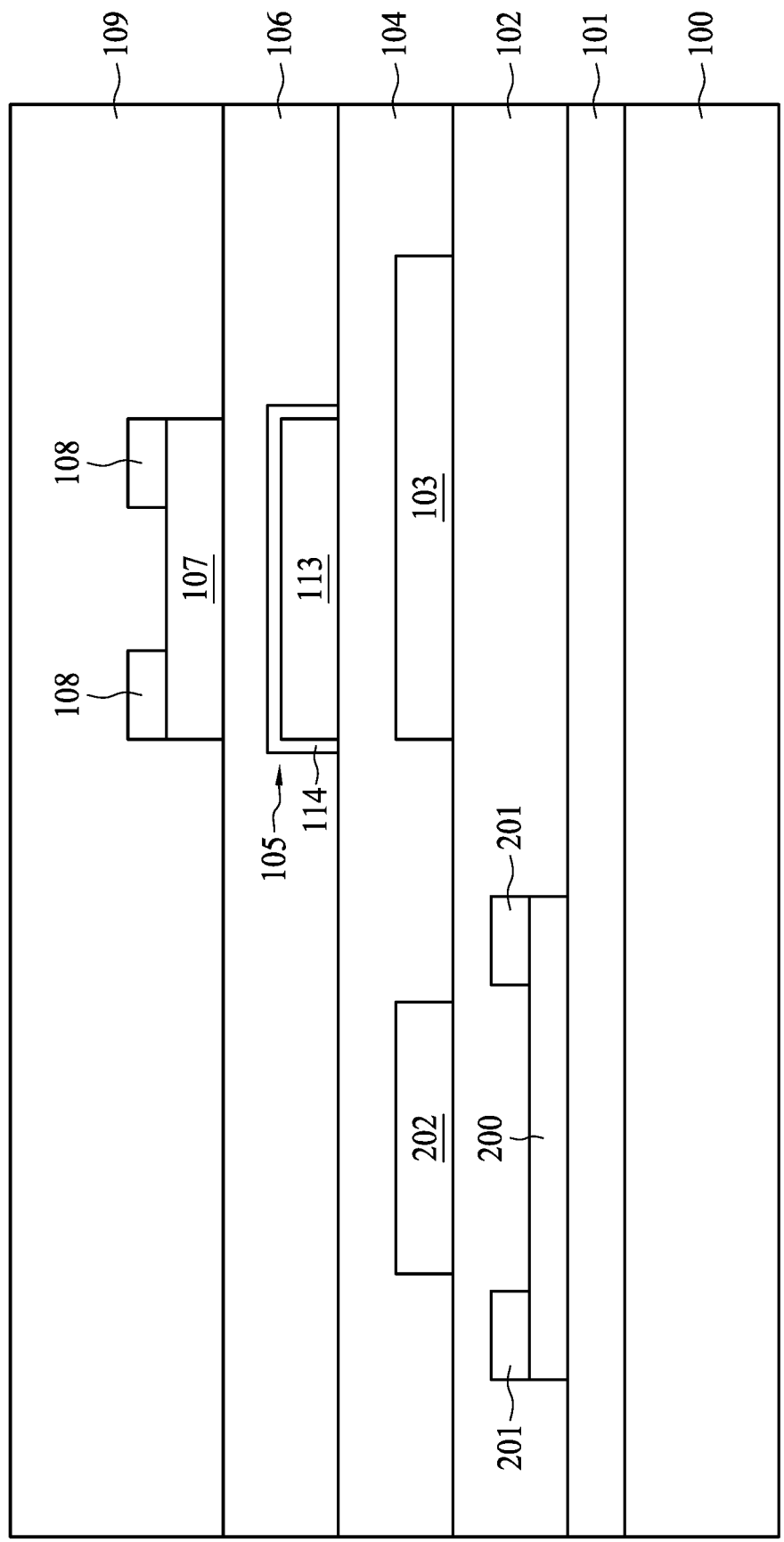

With reference to FIG. 10 and FIG. 22, at step S24, a fifth insulating layer 109 is formed on the fourth insulating layer 106 and encompasses the second semiconductor layer 107 and the second electrodes 108. The fifth insulating layer 109 may be formed of silicon oxide, silicon oxynitride, silicon nitride oxide, silicon nitride, aluminum oxide, hafnium oxide, yttrium oxide, zirconium oxide or the like. In the embodiment depicted, the fifth insulating layer 109 is formed of silicon oxide.

Figure 23:
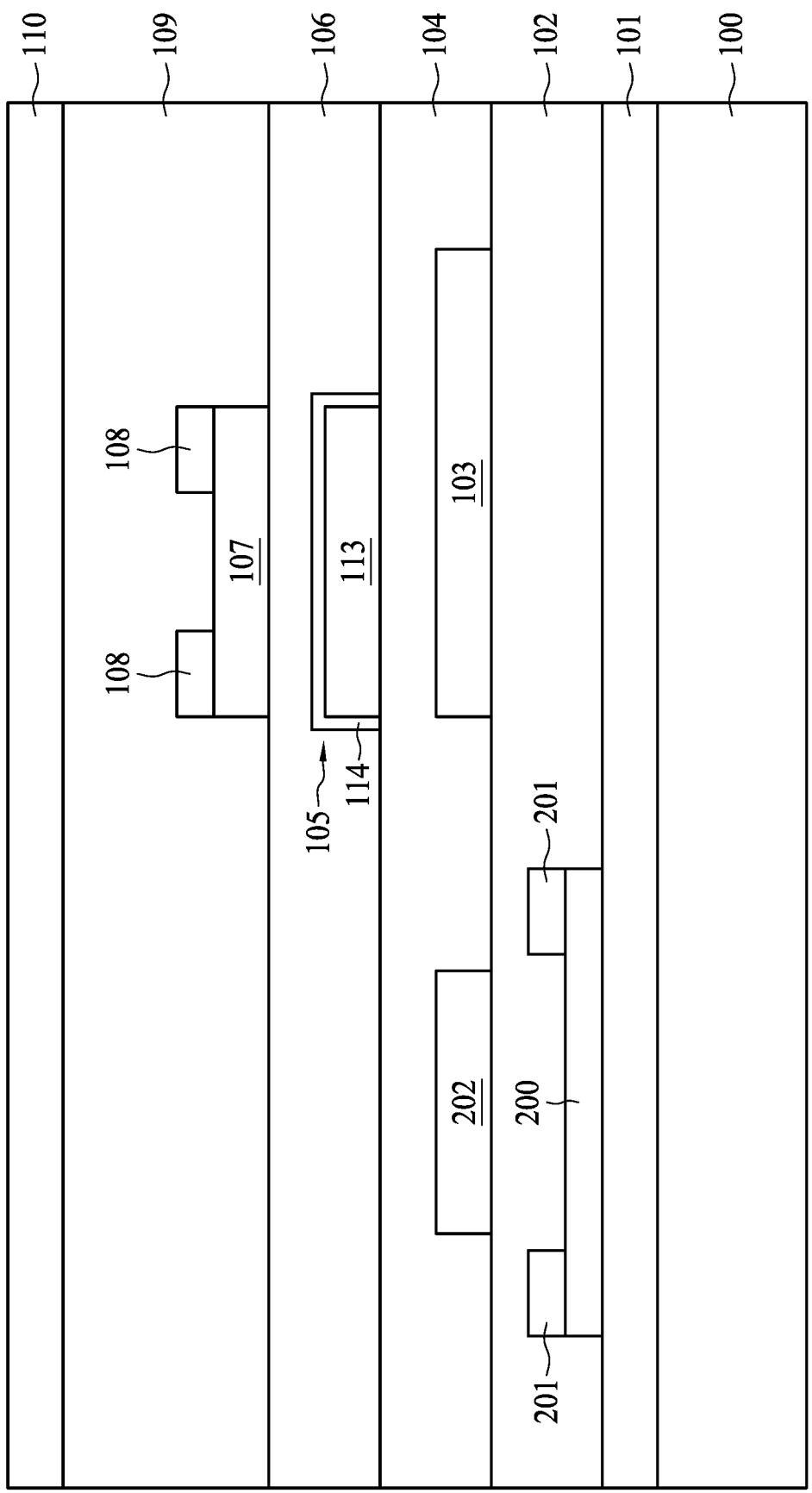

With reference to FIG. 10 and FIG. 23, at step S26, a sixth insulating layer 110 is formed on the fifth insulating layer 109. The sixth insulating layer 110 may be formed of silicon oxide, silicon oxynitride, silicon nitride oxide, silicon nitride, aluminum oxide, hafnium oxide, yttrium oxide, zirconium oxide or the like. In the embodiment depicted, the sixth insulating layer 110 is formed of silicon nitride.

Figure 24:
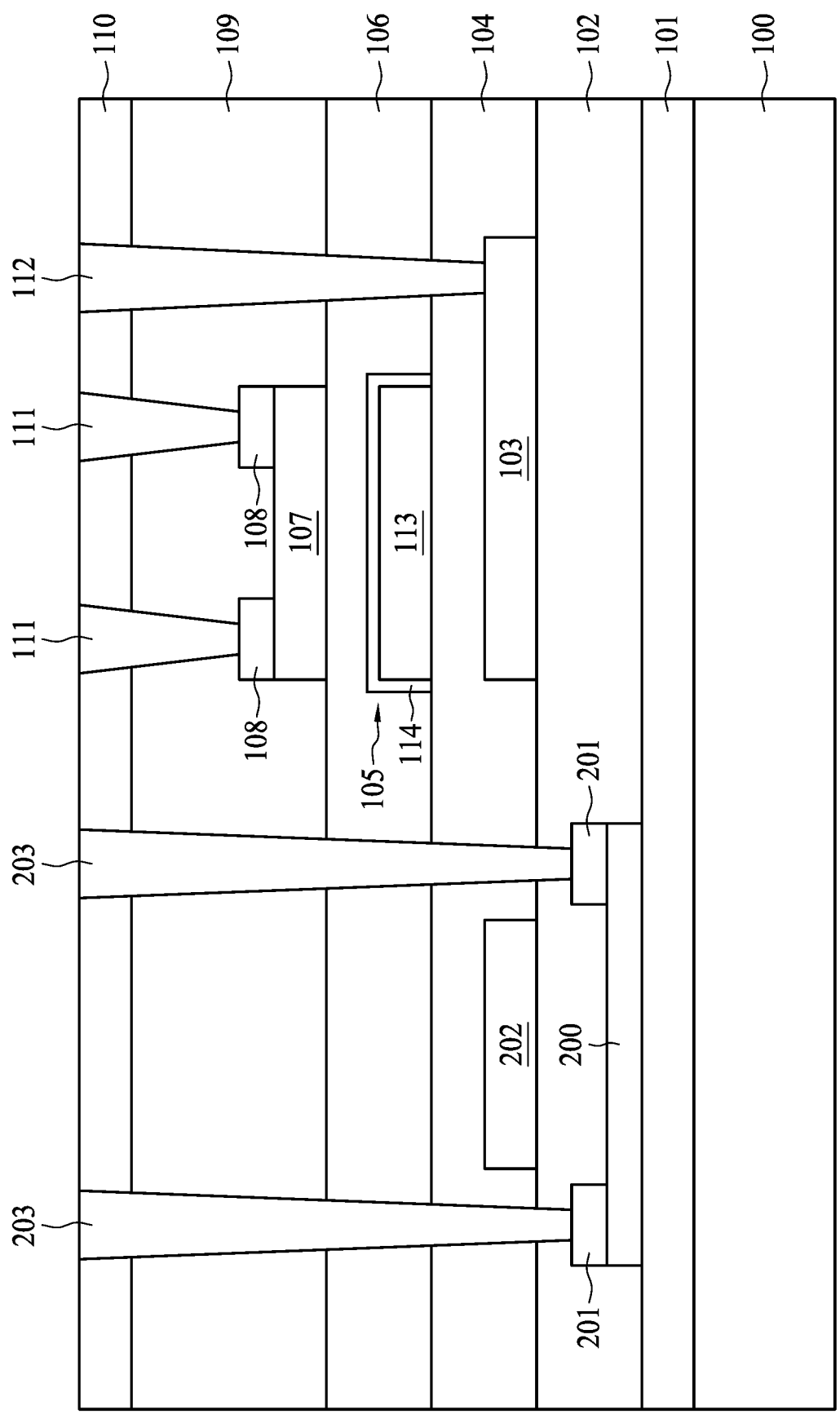

With reference to FIG. 10 and FIG. 24, at step S28, a plurality of terminals 203, 111, 112 are formed to pass through the insulating layers and respectively electrically connect to the first electrodes 201, the second electrodes 108, and the second gate layer 103 to form a semiconductor device 1. Note that a terminal electrically connecting to the first gate layer 200 is not shown in the cross-sectional view of FIG. 24. Specifically, the terminals 111 are formed to pass through the sixth insulating layer 110 and the fifth insulating layer 109 and respectively electrically connect to the second electrodes 108. The terminal 112 is formed to pass through the sixth insulating layer 110, the fifth insulating layer 109, the fourth insulating layer 106 and the third insulating layer 104 and electrically connect to the second gate layer 103. The terminals 203 are formed to pass through the sixth insulating layer 110, the fifth insulating layer 109, the fourth insulating layer 106, the third insulating layer 104 and the second insulating layer 102 and respectively electrically connect to the first electrodes 201. The plurality of terminals 111, 112, 203 are formed of, for example, a conductive material such as copper, aluminum or other suitable material. In the embodiment depicted, the plurality of terminals 111, 112, 203 are formed of copper.

Due to the function of the blocking structure 105 of the semiconductor device 1 according to the present disclosure, it is possible to suppress diffusion of impurities from layers below the blocking structure 105 and improve the reliability of the semiconductor device.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor device, comprising:
a substrate;
a semiconductor layer positioned above the substrate; and
a blocking structure positioned between the substrate and the semiconductor layer;
wherein a dimension of the blocking structure is greater than a dimension of the semiconductor layer;
wherein the blocking structure includes a barrier layer and a capping layer, the barrier layer and the capping layer are made of different conductive materials, and the capping layer includes a side portion with an inner surface at least covering two sides of the barrier layer and an outer surface contacting a first insulating layer;
wherein the barrier layer has a dimension equal to a dimension of the semiconductor layer; and
wherein a bottom surface of the semiconductor layer contacts the blocking structure.

2. The semiconductor device of claim 1, wherein the barrier layer is formed of copper, and the capping layer is formed of an alloy of copper and germanium.

3. The semiconductor device of claim 2, wherein a thickness of the capping layer is about 2 nanometers to 10 nanometers.

4. A method for manufacturing a semiconductor device, comprising:
providing a substrate;
forming a first semiconductor layer above the substrate;
forming a first insulating layer above the first semiconductor layer;
forming a first gate layer and a second gate layer above the first insulating layer, wherein the first insulating layer is opposite to the first semiconductor layer;
forming a blocking structure above the second gate layer, wherein the blocking structure is opposite to the second gate layer, wherein the blocking structure includes a barrier layer and a capping layer, the barrier layer and the capping layer are made of different conductive materials, and the capping layer includes a side portion with an inner surface at least covering two sides of the barrier layer;
forming a second insulating layer above the second gate layer, wherein the second insulating layer contacts an outer surface of the side portion of the capping layer;
forming a second semiconductor layer above the second insulating layer, wherein a dimension of the blocking structure is greater than a dimension of the second semiconductor layer.

5. A semiconductor device, comprising:
a substrate;
a semiconductor layer positioned above the substrate; and
a blocking structure positioned between the substrate and the semiconductor layer;
wherein a dimension of the blocking structure is greater than a dimension of the semiconductor layer;

wherein the blocking structure includes a barrier layer and a capping layer, the barrier layer and the capping layer are made of different conductive materials, and the capping layer includes a side portion with an inner surface at least covering two sides of the barrier layer and an outer surface contacting a first insulating layer;

wherein the semiconductor device further comprises a second insulating layer, wherein the second insulating layer is positioned between the blocking structure and the substrate;

wherein the barrier layer has a dimension equal to a dimension of the semiconductor layer; and wherein a bottom surface of the semiconductor layer contacts the blocking structure.

6. The semiconductor device of claim 5, wherein the barrier layer is formed of copper, and the capping layer is formed of an alloy of copper and germanium.

7. The semiconductor device of claim 6, wherein a thickness of the capping layer is about 2 nanometers to 10 nanometers.

* * * * *